US00RE48871E

(19) United States
(12) Reissued Patent
Soininen et al.

(10) Patent Number: US RE48,871 E
(45) Date of Reissued Patent: Jan. 4, 2022

(54) METHOD AND APPARATUS FOR DEPOSITING THIN FILMS ON A SURFACE

(71) Applicant: ASM IP HOLDING B.V., Almere (NL)

(72) Inventors: Pekka J. Soininen, Espoo (FI); Sven Lindfors, Espoo (FI)

(73) Assignee: ASM IP HOLDING B.V., Almere (NL)

(21) Appl. No.: 16/834,594

(22) Filed: Mar. 30, 2020

Related U.S. Patent Documents

Reissue of:
(64) Patent No.: 7,537,662
Issued: May 26, 2009
Appl. No.: 10/428,207
Filed: Apr. 29, 2003

(51) Int. Cl.
*C23C 16/455* (2006.01)
*C23C 16/44* (2006.01)

(52) U.S. Cl.
CPC .... *C23C 16/45565* (2013.01); *C23C 16/4412* (2013.01); *C23C 16/45544* (2013.01); *C23C 16/45574* (2013.01)

(58) Field of Classification Search
CPC ..... C23C 16/45565; C23C 16/45544; C23C 16/4412; C23C 16/45574
See application file for complete search history.

(56) References Cited

U.S. PATENT DOCUMENTS 3,717,439 A * 2/1973 Sakai ..... C23C 16/4411 118/715
3,854,443 A 12/1974 Baerg ..... 118/724
(Continued)

FOREIGN PATENT DOCUMENTS

CN 1991541 7/2007
EP 0 015 390 B1 9/1985
(Continued)

OTHER PUBLICATIONS

Koleske et al., "Atomic layer epitaxy based of Si of Ge(100) using $Si_2Ci_2$ and atomic hydrogen," Appt. Phys. Lett., vol. 64, No. 7 (Feb. 14, 1994) pp. 884-886.

(Continued)

*Primary Examiner* — Minh Nguyen
(74) *Attorney, Agent, or Firm* — Knobbe, Martens, Olson & Bear LLP

(57) ABSTRACT

A method and apparatus for depositing thin films onto a substrate is provided. The apparatus includes a gas injection structure that is positioned within a reaction chamber that has a platform. The gas injection structure may be positioned above or below the platform and comprises a first gas injector and a second gas injector. The first gas injector is in fluid communication with a first reactant source and a purge gas source. Similarly, the second gas injector is in fluid communication with a second reactant source and a purge gas source. The first and second injectors include hollow tubes with apertures opening to the reaction chamber. In one configuration, the tubes are in the form of interleaved branching tubes forming showerhead rakes. Methods are provided for deposition, in which multiple pulses of purge and reactant gases are provided for each purge and reactant step.

46 Claims, 16 Drawing Sheets

(56) References Cited

U.S. PATENT DOCUMENTS 4,033,286 A * 7/1977 Chern ..... C23C 16/4412 118/725
4,358,686 A * 11/1982 Kinoshita
4,413,022 A * 11/1983 Suntola ..... C23C 16/45544 117/89
4,522,149 A 6/1985 Garbis et al. ..... 118/725
4,523,985 A * 6/1985 Dimock ..... 204/298.25
4,579,618 A * 4/1986 Celestino
4,582,720 A 4/1986 Yamazaki ..... 427/573
4,590,042 A * 5/1986 Drage ..... 422/186.06
4,595,484 A 6/1986 Giammarco et al. .... 204/208.33
4,597,618 A 7/1986 Reimer ..... 439/374
4,694,779 A 9/1987 Hammond et al. ..... 118/730
4,738,748 A 4/1988 Kisa
4,798,165 A 1/1989 deBoer et al. ..... 118/715
4,851,095 A 7/1989 Scobey et al. ..... 204/192.12
4,992,301 A 2/1991 Shishiguchi et al.
5,010,842 A * 4/1991 Oda et al. ..... 118/723 ME
5,102,523 A 4/1992 Beisswenger et al.
5,252,133 A 10/1993 Miyazaki et al.
5,356,673 A 10/1994 Schmitt et al. ..... 427/446
5,370,709 A 12/1994 Kobayashi
5,422,139 A 6/1995 Fischer
5,453,124 A 9/1995 Moslehi et al.
5,500,256 A 3/1996 Watabe ..... 427/579
5,542,559 A 8/1996 Kawakami et al.
5,551,982 A 9/1996 Anderson et al. ..... 118/715
5,595,606 A 1/1997 Fujikawa et al. ..... 118/725
5,622,606 A 4/1997 Kugler et al.
5,624,498 A 4/1997 Lee et al. ..... 118/715
5,656,123 A 8/1997 Salimian et al.
5,669,975 A 9/1997 Ashtiani ..... 118/723 I
5,674,320 A 10/1997 Kordina et al. ..... 118/500
5,683,537 A * 11/1997 Ishii ..... 156/345.33
5,685,914 A 11/1997 Hills et al.
5,711,811 A 1/1998 Suntola et al. ..... 118/719
5,716,453 A * 2/1998 Chen ..... 118/715
5,766,364 A 6/1998 Ishida et al.
5,781,693 A 7/1998 Ballance et al.
5,792,261 A 8/1998 Hama et al.
5,811,022 A 9/1998 Savas et al. ..... 216/68
5,884,009 A 3/1999 Okase
5,888,907 A 3/1999 Tomoyasu et al.
5,916,365 A 6/1999 Sherman ..... 117/92
5,938,333 A 8/1999 Kearney
5,983,906 A 11/1999 Zhao et al.
6,001,175 A * 12/1999 Maruyama ..... C30B 25/10 117/102
6,015,590 A 1/2000 Suntola et al.
6,025,013 A 2/2000 Heming et al.
6,042,652 A 3/2000 Hyun et al. ..... 118/719
6,097,005 A 8/2000 Akimoto
6,111,225 A 8/2000 Ohkase et al.
6,148,761 A 11/2000 Majewski et al. ..... 118/715
6,183,565 B1 2/2001 Granneman et al.
6,184,158 B1 2/2001 Shufflebotham et al. .... 438/788
6,200,389 B1 3/2001 Miller et al. ..... 118/729
6,200,893 B1 3/2001 Sneh ..... 438/685
6,270,571 B1 8/2001 Iwasaki et al. ..... 117/88
6,291,800 B1 * 9/2001 Shirakawa et al. ..... 219/390
6,305,314 B1 10/2001 Sneh et al. ..... 118/723 R
6,333,019 B1 12/2001 Coppens
6,342,277 B1 1/2002 Sherman ..... 427/562
6,364,949 B1 4/2002 Or et al. ..... 118/69
6,368,987 B1 4/2002 Kopacz et al. ..... 438/788
6,399,922 B2 6/2002 Okase et al.
6,416,822 B1 7/2002 Chiang et al. ..... 427/561
6,428,859 B1 8/2002 Chiang et al. ..... 427/457
6,435,428 B2 8/2002 Kim et al.
6,446,573 B2 9/2002 Hirayama et al. ... 118/723 MW
6,478,872 B1 * 11/2002 Chae et al. ..... 117/88
6,485,564 B1 11/2002 Liu et al.
6,502,530 B1 1/2003 Turlot et al.
6,537,418 B1 3/2003 Muller et al.
6,736,408 B2 5/2004 Olgado et al.
6,806,211 B2 * 10/2004 Shinriki ..... C23C 16/40 118/715
6,890,386 B2 5/2005 DeDontney et al.
6,921,437 B1 7/2005 DeDontney et al.
7,273,526 B2 9/2007 Shinriki et al.
8,409,988 B2 4/2013 Takarawa et al.
8,808,455 B2 8/2014 Saito et al.
8,951,919 B2 2/2015 Sasajima et al.
9,165,761 B2 10/2015 Hirose et al.
9,318,316 B2 4/2016 Takesawa et al.
9,583,338 B2 2/2017 Hashimoto et al.
2002/0066411 A1 6/2002 Chiang et al. ..... 118/724
2002/0068458 A1 6/2002 Chiang et al. ..... 438/694
2002/0092471 A1 7/2002 Kang et al.
2002/0197402 A1 12/2002 Chiang et al. ..... 427/255.39
2003/0143328 A1 7/2003 Chen et al.
2004/0050325 A1 3/2004 Samoilov et al.
2004/0050326 A1 3/2004 Thilderkvist et al.
2004/0142558 A1 7/2004 Granneman
2004/0216665 A1 11/2004 Soininen et al.
2004/0221809 A1 11/2004 Ohmi et al.
2005/0208217 A1 9/2005 Shinriki et al.
2007/0243317 A1 * 10/2007 Du Bois ..... H01L 21/67757 427/98.9
2010/0055927 A1 3/2010 Hirose et al.
2018/0151347 A1 5/2018 Hanashima et al.

FOREIGN PATENT DOCUMENTS

EP 0015390 9/1985
EP 0 550 058 A2 7/1993
EP 0550058 7/1993
JP 61-101020 5/1986
JP 61-101020 A 5/1986
JP 61-263118 11/1986
JP 61-263118 A 11/1986
JP 61-294812 12/1986
JP 62-021237 1/1987
JP 62-080271 4/1987
JP 62-080271 A 4/1987
JP 63-136532 6/1988
JP 02-030119 1/1990
JP 02-030119 A 1/1990
JP 02-034915 2/1990
JP Hei3-184326 8/1991
JP 04-078130 3/1992
JP 04075328 3/1992
JP 04075328 A 3/1992
JP Hei5-198517 8/1993
JP 09129555 5/1997
JP 09129555 A 5/1997
JP 11121381 4/1999
JP 11121381 A 4/1999
JP 2000058534 2/2000
JP 2001-358080 12/2001
JP 2002121677 4/2002
JP 2002121677 A 4/2002
JP 2003060186 2/2003
JP 2003060186 A 2/2003
JP 2004292872 10/2004
JP 2004292872 A 10/2004
WO WO 96/17106 6/1996
WO WO 96/17969 6/1996
WO WO 00/12964 3/2000
WO WO 00/63957 10/2000
WO WO 00/79019 12/2000
WO WO 00/79019 A1 12/2000
WO WO 00/79576 12/2000
WO WO 00/79576 A1 12/2000
WO WO 01/00680 1/2001
WO WO 01/00680 A1 1/2001
WO WO 01/17692 3/2001
WO WO 01/17692 A1 3/2001
WO WO 02/08488 1/2002
WO WO 02/08488 A1 1/2002
WO WO 02/015243 2/2002
WO WO 02/26192 4/2002

(56) References Cited

FOREIGN PATENT DOCUMENTS

| | | |
|---|---|---|
| WO | WO 02/26192 A2 | 4/2002 |
| WO | WO 03/023835 | 3/2003 |

OTHER PUBLICATIONS

Mahajan et al., "Si atomic layer epitaxy based on $Si_2H_5$ and remote He plasma bombardment," Thin Solid Films, vol. 225 (1993) pp. 177-182.
Singh et al., "Measurement of neutral and ion composition, neutral temperature, and electron energy distribution function in a $CF_4$ inductively coupled plasma, "J. Vac. Sci. Technol. A., vol. 19, No. 3 (May/Jun. 2001) pp. 718-729.
Singh et al., "Measurements of the electron energy distribution function in molecular gases in a shielded inductively coupled plasma," J. of Appl. Phys., vol. 88, No. 7, (Oct. 2000) pp. 3889-3898.
Sugahara et al., "Atomic hydrogen-assisted ALE of germanium," Appl. Surf. Sci., vol. 90 (1995) pp. 349-356.
Sugahara et al., "Atomic layer epitaxy of germanium," Appl. Surf. Sci., vol. 82/83 (1994) pp. 380-396.
Sugahara et al., "Modeling of germanium atomic-layer-epitaxy," Appl. Surf. Sci., vol. 122 (1997) pp. 176-186.
May 24, 2018 Petition for IPR of U.S. Pat. No. 7,537,662, *Hitachi Kokusai Electric* v. *ASM IP Holding* (IPR2018-01151).
May 24, 2018 Exhibits 1003 to 1015 to the Petition for IPR of U.S. Pat. No. 7,537,662, *Kokusai* v. *ASM* (3 uploads).
Sep. 5, 2018 Patent Owner's Preliminary Response to Petition, *Kokusai* v. *ASM* (IPR2018-01151).
Mar. 4, 2019 Patent Owner's Motion to Amend, *Kokusai* v. *ASM* (IPR2018-01151).
Mar. 4, 2019 Patent Owner's Response to Petition, *Kokusai* v. *ASM* (IPR2018-01151).
Jun. 3, 2019 Petitioners Opposition to the Motion to Amendment, *Kokusai* v. *ASM* (IPR2018-01151).
Dec. 3, 2018 Board Decision, *Kokusai* v. *ASM* (IPR2018-01151).
Aug. 20, 2019 Order—Termination of Proceedings, *Kokusai* v. *ASM* (IPR2018-01151).
May 24, 2018 Declaration of Dr. Eric Eisenbraun, *Kokusai* v. *ASM* (IPR2018-01151).
McGraw-Hill Dictionary of Scientific and Technical Terms, $5^{th}$ Edition (1994) definition of the word "end effector".
de Keijser et al., "Atomic layer epitaxy of gallium arsenide with the use of atomic hydrogen," *Appl. Phys. Lett.*, vol. 58, No. 11, Mar. 18, 1991, pp. 1187-1189.
Imai et al., "Atomic layer epitaxy of Si using atomic H," *Thin Solid Films*, vol. 225, (1993), pp. 168-172.
Mahajan et al., "Si atomic layer epitaxy based on $Si_2H_6$ and remote He plasma bombardment," *Thin Solid Films*, vol. 225, (1993), pp. 177-182.
Sugahara et al., "Atomic hydrogen-assisted ALE of germanium," *Applied Surface Science*, vol. 90, (1995), pp. 349-356.
Sugahara et al., "Atomic layer epitaxy of germanium," *Applied Surface Science*, vol. 82/83, (1994), pp. 380-386.
Sugahara et al., "Modeling of germanium atomic-layer-epitaxy," *Applied Surface Science*, vol. 122,(1997), pp. 176-186.

* cited by examiner

METHOD AND APPARATUS FOR DEPOSITING THIN FILMS ON A SURFACE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue of U.S. Pat. No. 7,537,662, which issued May 26, 2009, from U.S. patent application Ser. No. 10/428,207, filed Apr. 29, 2003.*

FIELD OF THE INVENTION

The present invention relates generally to a semiconductor processing apparatus and more particularly, a semiconductor processing apparatus for depositing thin films on a substrate surface.

BACKGROUND OF THE INVENTION

Thin films may be grown on the surface of substrates by several different methods. These methods include vacuum evaporation deposition, molecular beam epitaxy (MBE), different variants of chemical vapor deposition (CVD) (including low-pressure and organometallic CVD and plasma-enhanced CVD), and atomic layer epitaxy (ALE), which has been more recently referred to as atomic layer deposition (ALD) for the deposition of a variety of materials.

In ALD, the sequential introduction of precursor species (e.g., a first precursor and a second precursor) to a substrate, which is located within a reaction chamber is generally employed. Typically, one of the initial steps of ALD is the adsorption of the first precursor on the active sites of the substrate. Conditions are such that no more than a monolayer forms so that the process is self-terminating or saturative. For example, the first precursor can include ligands that remain on the adsorbed species, which prevents further adsorption. Accordingly, deposition temperatures are maintained above the precursor condensation temperatures and below the precursor thermal decomposition temperatures. This initial step of adsorption is typically followed by a first removal (e.g., purging) stage, where the excess first precursor and possible reaction byproducts are removed from the reaction chamber. The second precursor is then introduced into the reaction chamber. The first and second precursor typically tend to react with each other. As such, the adsorbed monolayer of the first precursor reacts instantly with the introduced second precursor, thereby producing the desired thin film. This reaction terminates once the adsorbed first precursor has been consumed. The excess of second precursor and possible reaction byproducts are then removed, e.g., by a second purge stage. The cycle can be repeated to grow the film to a desired thickness. Cycles can also be more complex. For example, the cycles can include three or more reactant pulses separated by purge and/or evacuation steps.

Ideally, in ALD, the reactor chamber design should not play any role in the composition, uniformity or properties of the film grown on the substrate because the reaction is surface specific and self-saturating. However, only a few precursors exhibit such ideal or near ideal behavior. Factors that may hinder this idealized growth mode can include: time-dependent adsorption-desorption phenomena; blocking of the primary reaction through by-products of the primary reaction (e.g., as the by-products are moved in the direction of the flow, reduced growth rate down-stream and subsequent non-uniformity may result, such as when corrosive and less volatile halide products are produced as a byproduct of an ALD process alternating, e.g., $TiCl_4$+$NH_3$ to produce TiN); total consumption (i.e., destruction) of the second precursor in the upstream-part of the reactor chamber (e.g., decomposition of the ozone in the hot zone); and uneven adsorption/desorption of the first precursor caused by uneven flow conditions in the reaction chamber.

These problems have been partially alleviated with the use of a showerhead-type apparatus used to disperse the gases into the reaction space, such as disclosed in U.S. Pat. No. 4,798,165. The showerhead-type apparatus, as found in U.S. Pat. No. 4,798,165, may be positioned above a substrate so that the reactants and purge gases flow through apertures that are located on the showerhead and the gas flow may be directed perpendicular to the substrate. However, in such a configuration, in the course of time the reacted gases may form a film in the apertures and the apertures may become blocked. Such blockage may result in uneven deposit of layers onto the substrate.

PCT publication No. WO 00/79019, published Dec. 28, 2000 discloses use of hollow tubes with apertures for ALD deposition. In addition to issues with respect to blockage of the apertures, the disclosed structure contemplates relative rotation of either the substrate or the tubes during deposition. Such a construction leads to the additional issue that, for most efficient saturation of the substrate with reactant, rotation must be calculated to be an integral value in each reactant pulse, limiting flexibility in recipe design and risking non-uniformity. Furthermore, the complexity of rotating elements leads to risks of reactant leakage between rotating parts, consequent particle generation and/or safety hazards.

Thus, there is a need for an improved apparatus and method for depositing thin layers that addresses at least some of the problems described above.

SUMMARY OF THE INVENTION

In accordance with one aspect of the invention, an apparatus is provided for depositing a thin film on a substrate. The apparatus includes a reaction chamber having a reaction space, a substrate holder, a gas outlet in fluid communication with the reaction space and a gas injector structure positioned with the reaction chamber fixed relative to the substrate during deposition. The gas injector structure includes a first gas injector in fluid communication with a first reactant gas source and a purge gas source, and a second gas injector in fluid communication with a second reactant gas source and a purge gas source. The first and second gas injectors include hollow tubes extending in the reaction space, with a plurality of gas flow apertures spaced along respective tube axes of elongation, where the apertures open to the reaction space.

In one embodiment, the hollow tubes with apertures therein are positioned on opposite sides of the substrate holder. The apertures can face each other or away from one another in different arrangements. A similar third injector can provide a third reactant from a third side of the substrate holder. In another embodiment, the hollow tubes of each injector include tubes branching from distribution tubes on opposite sides of the substrate holder, the branching tubes of the different injectors staggered with one another along an injection plane adjacent a major surface of the substrate. In either of these embodiments, the exhaust can flow through the plane of the injectors. In yet another embodiment, the injectors are hollow tubes extending parallel to one another but stacked upon one another on one side of the substrate.

In accordance with another aspect of the invention, an apparatus is provided for depositing thin films on a substrate. The apparatus includes a reaction chamber, a substrate support and a showerhead rake structure positioned adjacent the substrate support. The showerhead rake structure includes a first gas injector having a first rake in fluid communication with a first reactant source, including a plurality of first fingers extending from and being in fluid communication with a first gas distribution structure. The showerhead rake structure also includes a second gas injector having a second rake in fluid communication with a second reactant source, the second rake including a plurality of second fingers extending from and being in fluid communication with a second distribution structure. Each of the first and second fingers have apertures along a length thereof.

In accordance with another aspect of the invention, a method is provided for depositing a thin layer on a substrate within a reaction space defined by chamber walls. The reaction chamber has a gas feed and removal structure including a first gas injector, a second gas injector, and a gas outlet. The first and second gas injectors comprise elongated tubes disposed within the reaction space and having apertures spaced therealong in fixed relation to the substrate during deposition. The method comprises at least one cycle including the following steps in sequence:

- a first reactant step including injecting a first vapor phase reactant into the reaction space through the apertures in the first injector while injecting purge gas through the apertures in the second injector;
- a first purge step including stopping the first reactant injection and injecting purge gas through the apertures in the first and second injectors into the reaction space;
- a second reactant step including injecting a second vapor phase reactant into the reaction space through the apertures in the second injector while injecting purge gas through the apertures in the first injector; and
- a second purge step including stopping the second reactant injection and injecting purge gas through the apertures in the first and second injectors into the reaction space.

In one embodiment, gases are exhausted through the elongated tube in route from the substrate to the outlet. Both reactant and purge gas is allowed to diffuse across gaps between the apertures and thereby saturate the substrate in each step. Advantageously, the purge steps can include multiple sequential pulses causing pressure fluctuation, which expedite diffusion between gaps in the apertures, and especially diffusion into deep narrow trenches of the substrate. Similarly, the reactant steps can include multiple sequential pulses causing pressure fluctuations to aid in diffusing reactant across the substrate or into deep, narrow features on the substrate. In one particular arrangement, a booster purge pulse, immediately prior to a standard purge pulse, helps clear reactant from the prior pulse and creates a pressure gradient, while also clearing an inert gas diffusion barrier created by an inert gas valving arrangement.

In accordance with another aspect of the invention, a method is provided for atomic layer deposition. The method includes alternating reactant steps and intervening purge steps in a plurality of cycles, wherein at least some of the purge steps comprise multiple purge pulses. The multiple pulses creating pressure fluctuations within a reaction space.

Further aspects, features and advantages of the present invention will become apparent from the following description of the preferred embodiments.

BRIEF DESCRIPTION OF THE DRAWINGS

FIGS. 1-16 are non-limiting illustrations (not to scale) of deposition apparatuses constructed in accordance with various preferred embodiments.

FIG. 1 is a schematic top view of an ALD reactor constructed in accordance with one embodiment of the invention, showing a gas flow pattern during a first reactant pulse.

FIG. 3 is a schematic cross-sectional side view of one of the reactant in-feed systems of FIG. 1, showing the gas flow pattern during a reactant pulsing step.

FIG. 4 is a schematic top view of the ALD reactor as depicted in FIG. 1, showing the gas flow pattern during a purging step.

FIG. 5 is a schematic cross-sectional side view of the reactant in-feed system of FIG. 3, showing the gas flow pattern during a purging step.

FIG. 6 is the schematic top view of the ALD reactor as depicted in FIG. 1, showing a gas flow pattern during a second reactant pulse.

FIG. 7 is a schematic cross-sectional side view of the reactant in-feed system of FIG. 3, showing the gas flow pattern during an inactive gas booster step.

FIG. 8 is a schematic cross-sectional side view of an ALD reactor constructed in accordance with another embodiment of the invention.

FIG. 9 is a schematic top view of an ALD reactor constructed according to another embodiment of the present invention.

FIG. 10 is a schematic cross-sectional side view of an ALD reactor constructed according to another embodiment of the present invention.

FIG. 11 is a schematic cross-sectional side view of an ALD reactor according to still another embodiment of the invention.

FIG. 12 is a schematic cross-sectional view of the ALD reactor of FIG. 11 with an alternate type of reaction chamber sealing system.

FIG. 14 is a schematic cross-sectional view of an ALD reactor according to still another embodiment of the invention.

FIG. 15 is a schematic top view of a dual spiral showerhead, constructed in accordance with another embodiment of the invention.

DETAILED DESCRIPTION OF THE PREFERRED EMBODIMENTS

While not separately illustrated, the skilled artisan will readily appreciate that the flow sequences described herein can be controlled by software programming or hardwiring arranged to open and close gas control valves in the desired sequence.

Figure 1:
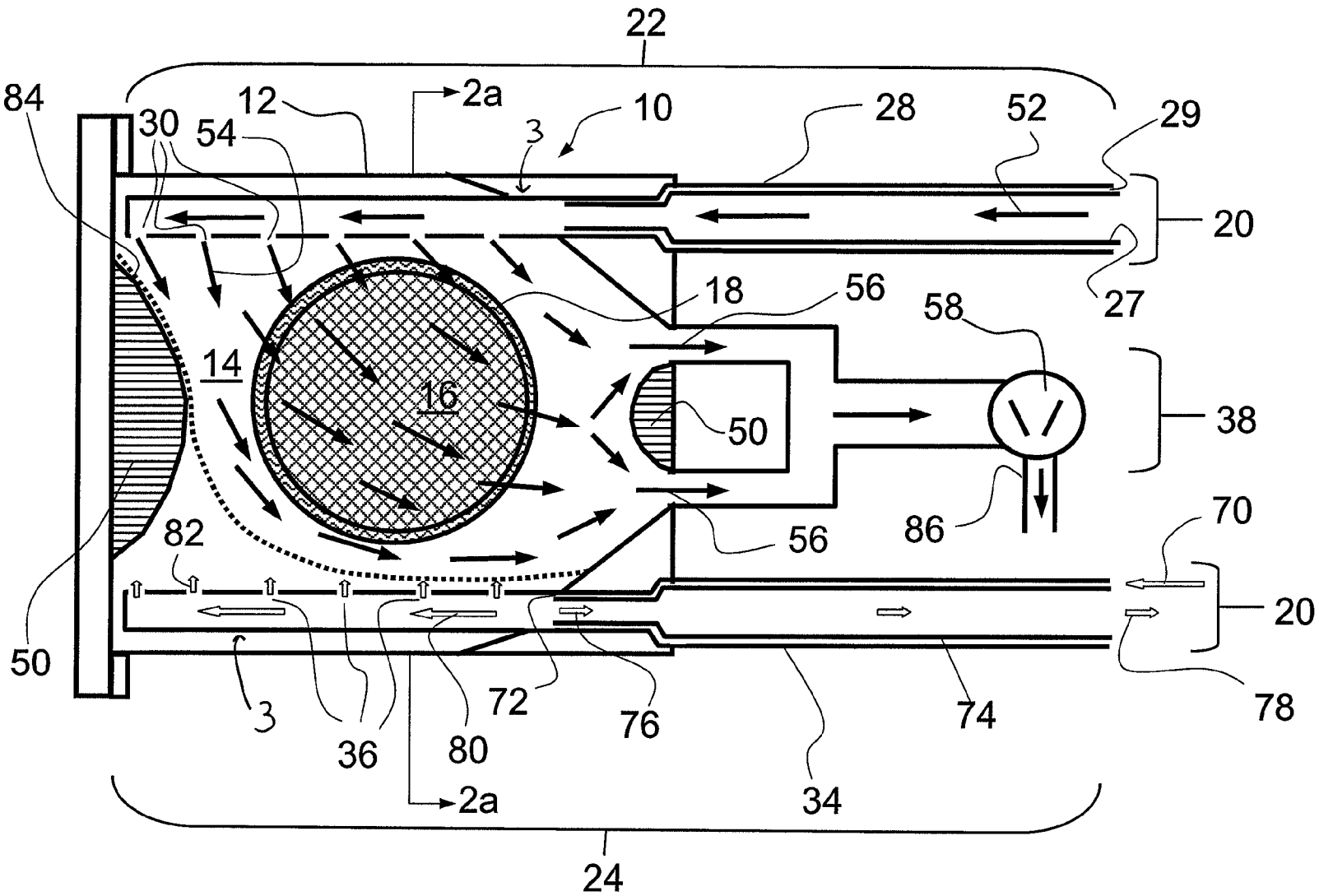

FIG. 1 illustrates a schematic top view of an embodiment of an atomic layer deposition (ALD) reactor 10. The ALD reactor 10 includes a reaction chamber 12, which defines, in part, a reaction space 14. A wafer or substrate 16 is disposed within the reaction chamber 12 and is supported by a platform or a single-substrate support. The substrate support of the illustrated embodiment also serves as a wafer handler 18 configured to move the wafer 16 in and out of the reaction chamber 12. The wafer handler 18 can be configured to receive the wafer 16 in such a way that the wafer 16 touches the handler 18 itself. Alternatively, the wafer handler can operate on the Bernoulli principle, whereby jets of inactive gas produce a low pressure zone between the handler and wafer. In a Bernoulli configuration the wafer can be held on top or on the bottom of the handler. The handler 18 can be robot end effector, or more preferably, can be configured to exchange a wafer with a separate robot end effector when the handler is lowered relative to the reaction chamber 12. While configured in the illustrated embodiments as a movable substrate support to facilitate loading and unloading substrates between depositions, the handler 18 preferably keeps the substrate 16 stationary relative to the gas injection structure (described below) during operation.

In the illustrated reactor 10, a gas inlet or injection structure 20 is provided. The gas injection structure 20 supplies two precursors, A and B, and inactive purge gas to the reaction space 14 and is located in a plane above the wafer or substrate 16. A skilled artisan will appreciate that the gas injection structure 20 may be positioned below the wafer or substrate 16, or to the side of a vertically positioned wafer or substrate in other arrangements and that such position will be dependent on the position of the wafer or substrate. Preferably, the injection structure is positioned on an adjacent plane to the substrate's major surface (as best seen in the cross-sectional end view of FIG. 2a). As will be appreciated from the discussion of FIG. 2a below, this arrangement permits exhaust flow through or along the space between injectors. The gas injection structure 20 is preferably readily replaceable, but is arranged to remain fixed relative to reactor walls, and preferably also fixed relative to the substrate 16, during deposition, facilitating rapid gas spreading by diffusion across the substrate during each reactant or purge pulse.

The gas injection structure 20 includes a first gas inlet or injector 22 and a second gas inlet or injector 24. The first gas inlet 22 is in communication with a first precursor A supply source (not shown) and a purging gas supply source (not shown). The first gas inlet may be connected to the supply sources via a single tube or multiple tubes, where each connection can be a tolerance fitting, o-ring seal, an axial shaft seal, or any other method of connection known by those skilled in the art. The purging gas is preferably an inactive gas, and may be, by way of example, nitrogen or argon. The purging gas may be used to transport the first and/or second precursor from the supply source to the reaction chamber 12. The purging gas may also be used to purge the reaction chamber and/or the gas inlets of excess reactant and reaction by-product gases. Note that, in FIG. 1, reactant gas is shown by black arrows in the first gas inlet 22, while purge gas is shown by white arrows in the second gas inlet 24.

As shown in FIG. 1, the first gas inlet or injector 22 includes a first outer tube 28, a first inner tube 27 and a plurality of appropriately spaced apertures 30 located along a distributor section of the length of the first outer tube 28. Generally, the length of the apertured distributor section in the first outer tube 28 is longer than the diameter of the wafer or substrate 16. The structure of the first gas inlet 22 will be described in greater detail below.

The gas injection structure 20 is used to deposit a thin layer onto a substrate. In this embodiment, the first precursor A is injected into the reaction chamber 12, it travels from the first precursor A supply source (not shown), through the first inner tube 27 (indicated by arrows 52), then through the first outer tube 28 and out (indicated by arrows 54) through the plurality of apertures 30 over the wafer or substrate 16 so that the first precursor A chemisorbs onto the wafer or substrate 16. Preferably, a monolayer (single molecular layer) of the first precursor A molecules is chemisorbed onto the wafer or substrate 16. During the first precursor A flow, a small amount of purge gas can simultaneously flow in a space 29 between the first inner tube 27 and the first outer tube 28 towards the reaction chamber 12, allowing the upstream section of the outer tube 28 tubing to remain substantially free from first precursor A. The space 29 thus serves as a first purge channel while the inner tube 27 provides a first reactant channel, which is preferably less restrictive than the first purge channel. The flow rate of the purge gas during the first precursor A flow can be, for example, 5-20% of the flow rate of the purge gas during the following purge step.

Once the chemisorption process has essentially self-terminated through consumption of available reactive surface sites, the purging gas flows from the purging gas supply source (not shown) first through the space 29 between the first outer tube 28 and the first inner tube 27, then through the first outer tube 28 and out (indicated by arrows 54) through the apertures 30. The path by which the gases travel may be hermetically sealed. For purposes of the present disclosure, "hermetically sealed" means that all the gas inlet surfaces upstream of the reaction chamber are exposed to only one precursor. Thus, the first gas inlet and the second gas inlet are preferably physically isolated from each other.

Similarly, the second precursor B is supplied to the reaction chamber 12 through the second gas inlet or injector 24, which is in communication with a second precursor B supply source (not shown) and a purging gas supply source (not shown). The second gas inlet may be connected to the supply source via a single tube or multiple tubes, where each connection can be a tolerance fitting, o-ring seal or axial shaft seal, or any other method of connection known by those skilled in the art. The second gas inlet 24 may be position in the same plane as the first gas inlet 22 (see FIG. 2a); in other arrangements, however, one skilled in the art may appreciate that the second gas inlet may be position above or below the level of the first gas inlet (see FIGS. 16a and 16b). In the illustrated embodiment, the distributer tube sections 3 (see FIG. 1) of the first gas inlet 22 and the second gas inlet 24 are positioned parallel to one another on opposite sides of the substrate 16, leaving a wide space (as wide as the substrate) therebetween for controlling exhaust flow.

The second gas inlet or injector 24 depicted in FIG. 1 is also shaped substantially tube-like and includes similar components as the first gas inlet 22, including a second inner tube 74, a second outer tube 34 and a plurality of apertures 36. According to one embodiment, the apertures 36 are directed toward the wafer or substrate 16. Thus, when the gases are injected into the reaction chamber 12, the second precursor B travels from the second precursor B supply source (not shown), first through the second inner tube 74, then through the distributor section of the second outer tube 34 and out through the plurality of apertures 36. Typically, in ALD the second precursor B molecules or radicals will react with the chemisorbed first precursor A that is already present on the substrate surface. During the second precursor B flow, a small amount of purge gas can simultaneously flow in a space 72 between the second inner tube 74 and the second outer tube 34 towards the reaction chamber allowing the upstream section of outer tube 34 to remain substantially free from second precursor B. The space 72 thus serves as a second purge channel while the inner tube 74 serves as a second reactant channel, which is preferably less restrictive than the second purge channel. The flow rate of the purge gas during the second precursor B flow can be, for example, 5-20% of the flow rate of the purge gas during the following purge step.

Once the desired chemisorption reaction on the surface is self-terminated, the purging gas flows from the purging gas supply source (not shown) first through the space 72 between the second inner tube 74 and the second outer tube 34. Then the purging gas flow is divided into two parts so that the first part flows through the distributor section of the second outer tube 34 and out through (indicated by arrows 82) the apertures 36. The excess second precursor B and possible reaction by-products are removed, e.g., purged from the reaction chamber 12. The second part of the purging gas flow goes through (indicated by arrows 76, 78) the second inner tube 74.

In the illustrated embodiment, excess first precursor A, excess second precursor B, reaction by-products and/or purging gas is removed from the reaction chamber 12 via a gas exhaust or outlet 56. As may be appreciated by one skilled in the art, the gas outlet 38 may be a vacuum or a simple outlet that employs a pressure gradient between the chamber and an outer environment, causing the gas in the reaction chamber to escape into the outer environment. Here, the gas outlet 56 is in fluid communication with a vacuum pump 58 or some other device used for generating vacuum. The vacuum pump 58 has a pump exhaust 86 for letting out gases from the vacuum pump 58. Additionally, in this embodiment, a flow pattern modifier 50 is shown at each of the exhaust end and the opposite end of the reaction space 14. The shapes of optional flow pattern modifiers 50 are selected according to the purging requirements of the reaction chamber 12, for example, circular or ovular or any other shape known by those skilled in the art. The flow pattern modifiers 50 prevents the formation of stagnant gas volumes inside the reaction chamber 12. Computer programs, such as FLUIDS32 Fluid Flow Analyzer developed by Dr. Stanislaw Raczynski, can be used for simulating the gas flow patterns and determining the optimum shapes of the flow pattern modifiers 50. Flow pattern modifiers can be independent parts that are attached into the reaction chamber 12 or they can be integral parts of the reaction space 12.

This deposition cycle of first precursor A injection, first purge, second precursor B injection and second purge may be repeated as many times as necessary, depending on the desired thickness of the thin film to be deposited.

Figure 2D:
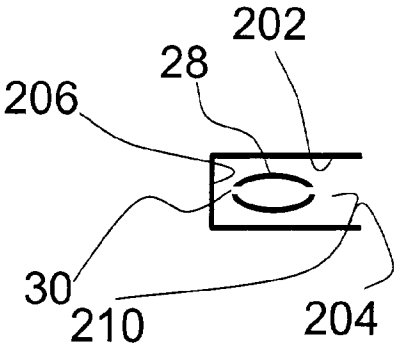
FIGS. 2b-2d are schematic cross-sections showing alternative gas inlet configurations.
Figure 2C:
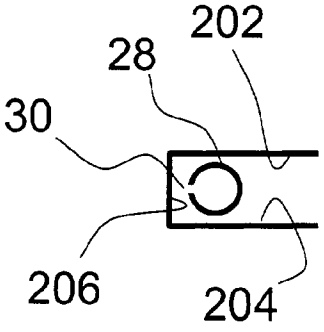
Figure 2B:
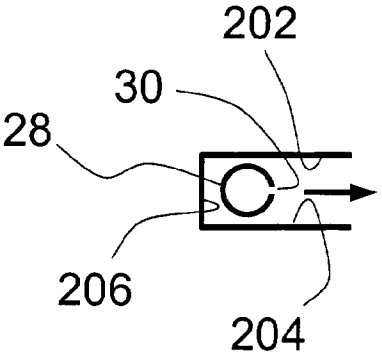
Figure 2A:
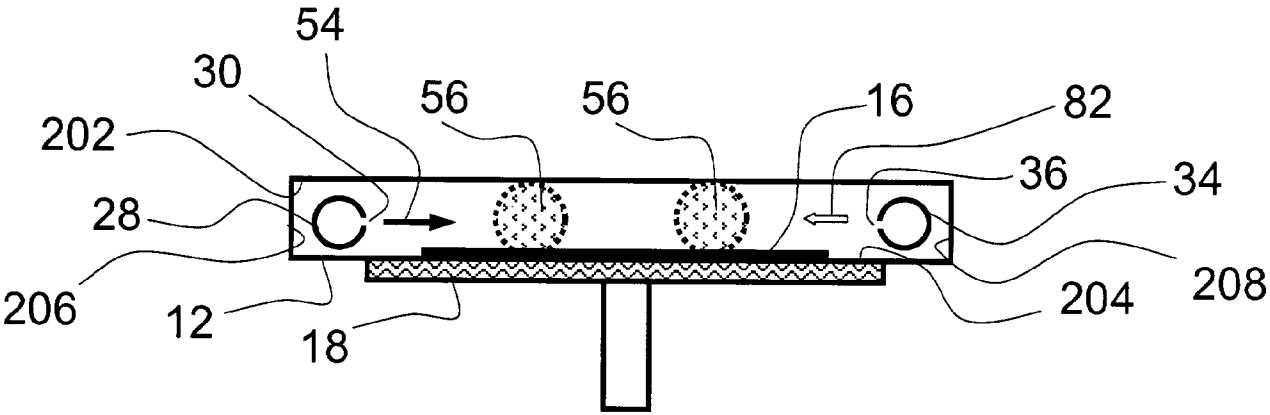
FIG. 2a is a schematic cross section view taken along lines 2a-2a of FIG. 1.

A schematic cross sectional view of the ALD reactor 10 depicted in FIG. 1 is shown in FIG. 2a and provides further detail of the apertures 30 and 36. A substrate 16 is supported by a heated platform or a wafer handler 18. The first outer tube 28 and the second outer tube 34 are placed at opposite sides of the substrate 16. Apertures 30 in the first outer tube 28 and apertures 36 in the second outer tube 34 are directed towards the substrate 16. The apertures 30 are preferably about 10-30 mm apart from each other. The distance between the apertures 36 can be similar, e.g., about 10-30 mm. As illustrated, the gas injectors are on a plane above the substrate 16, positioned such that exhaust can flow along or through the space between the injector tubes 28, 34. In the illustrated embodiment, at least part of the exhaust opening 56 is positioned above the injection plane defined by the apertures 30, 36.

Referring to FIGS. 2b-2d, in other arrangements, the apertures 30 and 36 can be directed towards the ceiling 202, the floor 204 or the side walls 206 and 208 of the reaction chamber 12. FIG. 2b shows a setup where the apertures 30 in the first outer tube 28 are directed away from the side wall 206 towards the substrate, similar to the arrangement of FIG. 2a. In the illustrated arrangement, the outer tube 28 is shown spaced away from the side wall 206. It will be appreciated by the skilled artisan that, in other arrangements, the first outer tube can abut the side wall without spacing. Nevertheless, the first outer tube 28 preferably comprises an independent element that can be removed and replaced without effecting the integrity of the reaction chamber walls 202, 204, 206. In other words, as with the other embodiments in the present application, the gas injectors are not integrated with the walls but are rather removable and readily replaceable elements extending within the reaction chamber.

FIG. 2c shows another setup where the apertures 30 in the first outer tube 28 are directed towards the side wall 206. Gases exiting the apertures 30 will first hit the side wall 206 and then flow around the first outer tube 28. After that the gases will flow towards the substrate. One benefit of this setup is that the space between the first outer tube 28 and the side wall 206 is purged efficiently during the purge time between reactant pulses.

FIG. 2d shows still another setup where the first outer tube is flattened, the flattened part preferably including the distributor section along the length of the first outer tube 28 where the apertures 30 are located. The flattened first outer tube 28 has two sets of apertures 30 and 210. The first set of apertures 30 is directed "outwardly" towards the side wall 206 and the second set of apertures 210 is directed "inwardly" towards the substrate. One benefit of this setup is that stagnant gas pockets are eliminated from the reaction space and the gas volume of the reaction space can be purged very rapidly and efficiently.

The gas injectors are preferably made of materials that have very smooth surfaces so that the gas injectors can be purged rapidly. Examples of such preferred materials are glass (especially silica), electrochemically polished metal, silicon carbide, polymer, and ceramic- or glass-coated material. The gas injector structure is placed for example about 30-60 mm from the platform.

The tubes that form the gas injectors of the preferred embodiments can take other shapes in various arrangements. Thus, the outer and inner tubes can have, e.g., rectangular, polygonal or round cross sections. Preferably, however, the tubes that form the gas injectors are curved in a cross section taken along a plane perpendicular to the axis of the tube, as shown in FIGS. 2b-2d. A smooth curvature facilitates gas flow around the tube, particularly for embodiments in which gas is designed to exit an aperture on one side of the tube and either flow or have excess purged around the opposite side of the tube. In the illustrated embodiments, the injector tubes include a plurality of axially spaced apertures opening perpendicularly from the tube axis.

Figure 3:
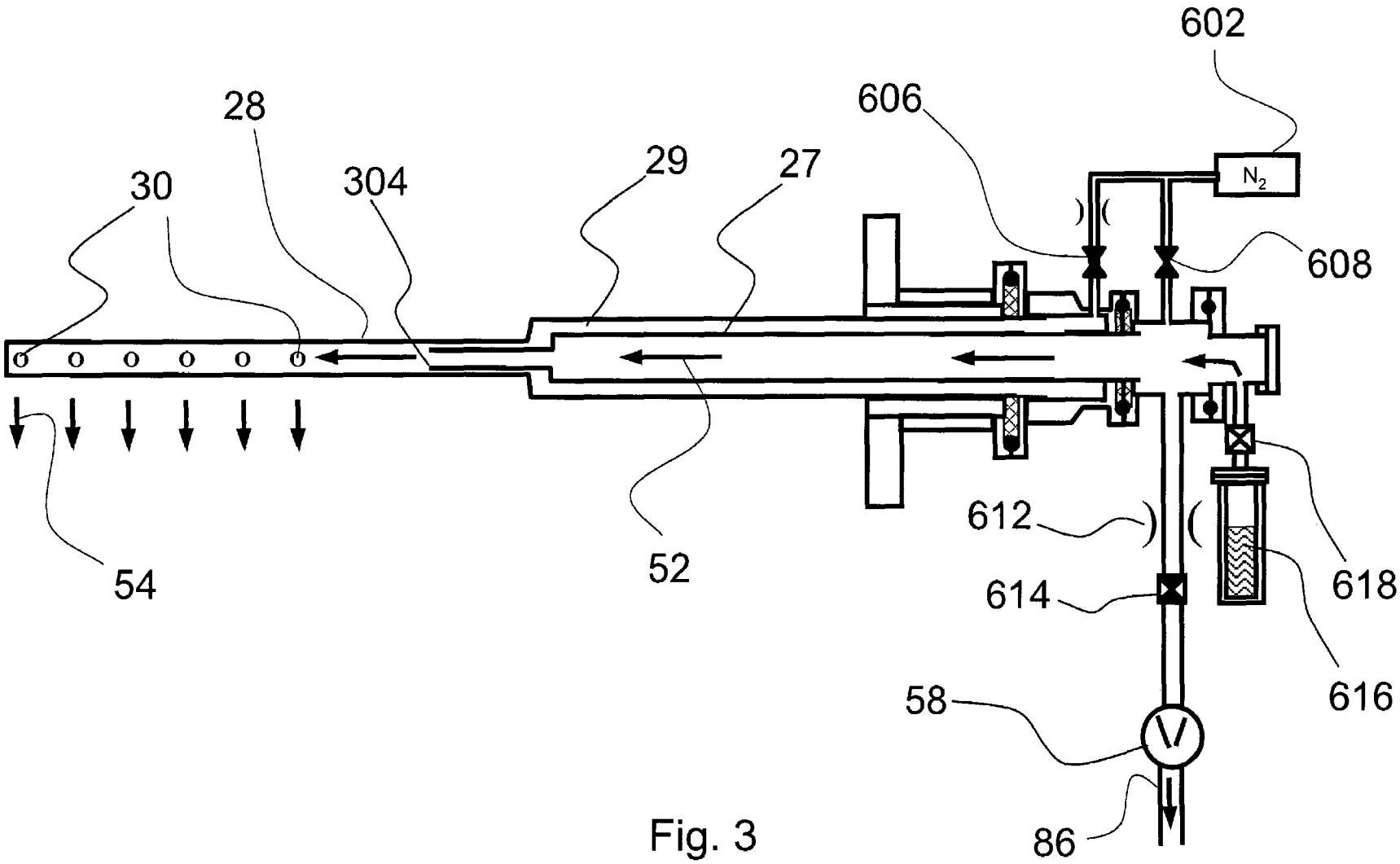

FIG. 3 further illustrates a cross-sectional side view of a gas injection structure and shows the reactant in-feed system and gas flow pattern during a reactant pulsing step. When first precursor A gas is let into the reaction chamber, a purge gas valve 606, a booster valve 608 and a source exhaust valve 614 are kept closed. The source control valve 618 of the first precursor A source 616 is opened. Vapor of the first precursor reactant A flows through the source control valve 618, through (indicated by arrows 52) the first inner tube 27, through the first outer tube 28 and through the apertures 30 of the first outer tube 28 to the reaction space. In the case that the vapor pressure of the first precursor A is so low that the precursor vapor cannot come out of the first precursor A source 616, a carrier gas line (not shown) can be connected to the source 616 so that pressure increase inside the source 616 forces reactant vapor out of the source 616 to the first inner tube 27.

There are different ways of controlling the gas content of the flow space or purge channel 29 between the first inner tube 27 and the first outer tube 28. In the embodiment illustrated in FIG. 3, the purge gas valve 606 is kept closed so that gases are stagnant in the first purge channel 29 during the pulse time of the first reactant A. Alternatively, a by-pass capillary (not shown) lets a small amount of inactive gas flow (e.g., 5-20% of the purge flow during a purge step) from the controlled inactive gas source 602 past the closed purge gas valve 606 to the purge channel 29. One benefit of this embodiment is that the inactive gas keeps reactant A molecules away from the purge channel 29. The flow rate of the inactive gas is set to such a low level that a gas diffusion barrier is not formed near the tip 304 of the first inner tube 27 and the reactant A can flow towards the apertures 30. Those skilled in the art will appreciate that other ways to control the gas content in the flow space may also be employed.

Figure 4:
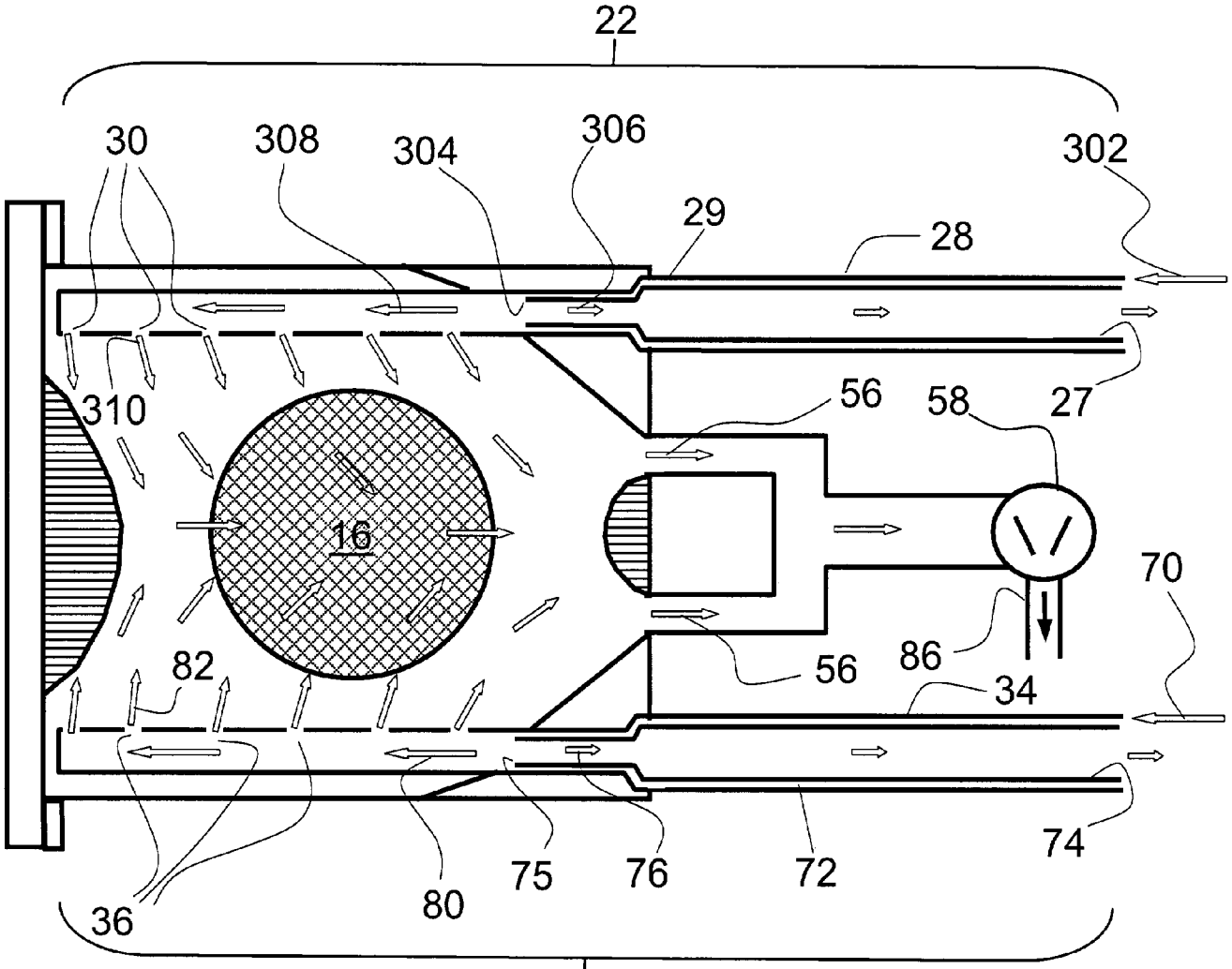

FIG. 4 shows a schematic top view of an ALD reactor as depicted in FIG. 1 showing a gas flow pattern during a purging step. As illustrated, the first gas inlet 22, including the first inner tube 27 and the first outer tube 28, is purged with inactive gas. Inactive gas flows 302 through the flow space or purge channel 29 between the first inner tube 27 and the first outer tube 28 until the tip 304 of the first inner tube 27 is reached. At the tip 304 the inactive gas flow 302 is divided into two parts 308 and 306. The various restrictions in flow encountered by the purge gas are arranged to ensure that the second part 306 of the inactive gas flows towards the inside of the first inner tube 27 and makes sure that any gaseous reactant residue inside the first inner tube 27 is pushed away from the tip 304 of the first inner tube 27. The first part 308 of the inactive gas flow continues through the first outer tube 28, exits from the apertures 30 and flows towards 310 the substrate 16.

Similarly, the second gas inlet 24, including the second inner tube 74 and the second outer tube 34, is purged with inactive gas. Inactive gas flow 70 is directed through the space 72 between the second inner tube 74 and the second outer tube 34 until the tip 75 of the second inner tube 74 is reached. At the tip 75, the inactive gas flow 70 is divided into two parts 80 and 76. The second part 76 of the inactive gas flows towards the inside of the second inner tube 74 and makes sure that any gaseous reactant residue inside the second inner tube 74 is pushed further away from the tip 75 of the second inner tube 74. The first part 80 of the inactive gas flow continues through the second outer tube 34, exits from the apertures 36 and flows 82 towards the substrate 16.

Figure 5:
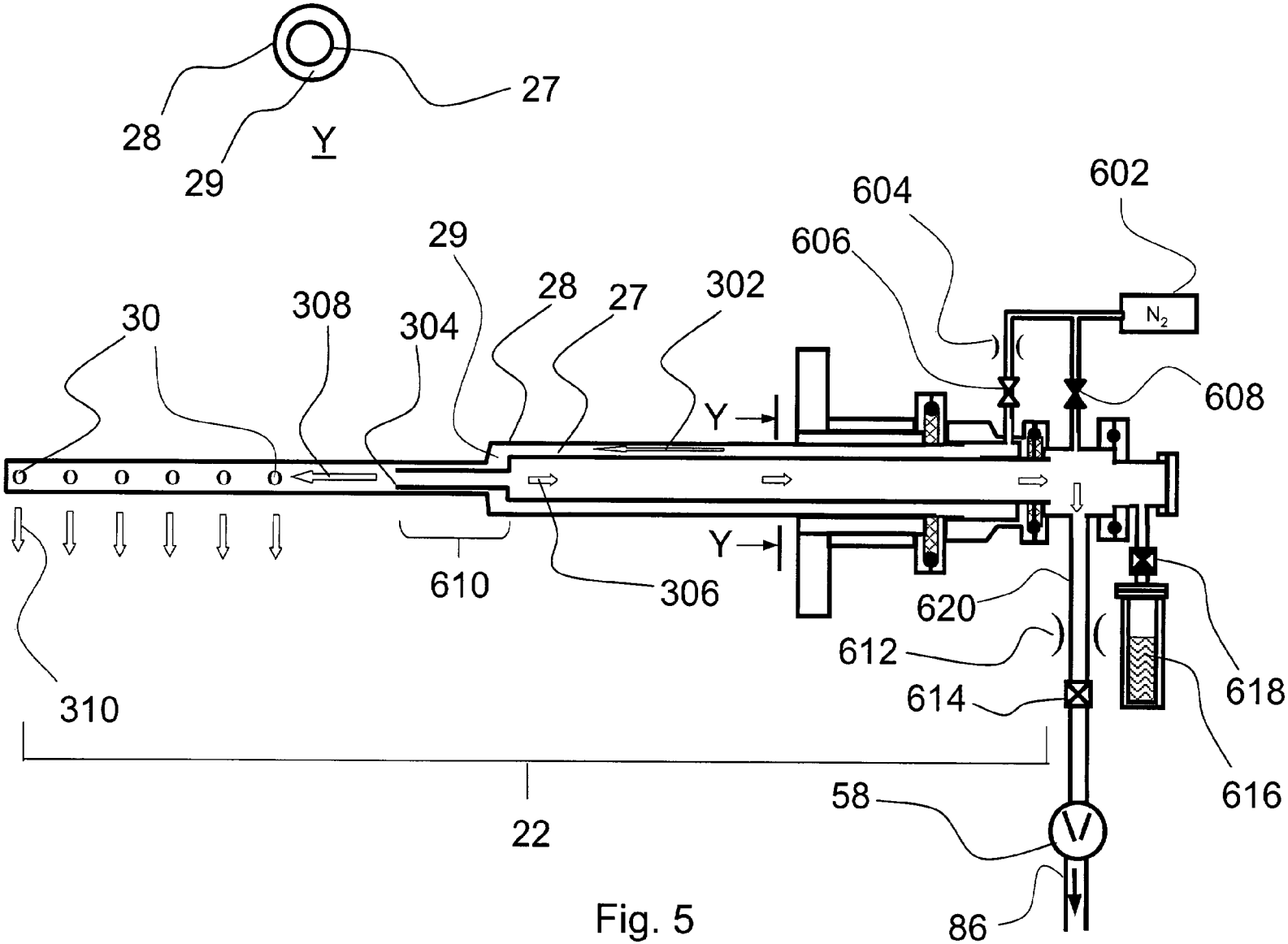

FIG. 5 shows a reactant in-feed system that can be used with an embodiment of the invention. The schematic cross-sectional side view of the reactant in-feed system depicts a gas flow pattern during the purging step. The gas inlet or injector 22 comprises a first outer tube 28 having apertures 30, a first inner tube 27 that is in fluid communication with a precursor source 616, a controlled exhaust line 620 and a controlled inactive gas source 602.

Inactive or "purge" gas is let from the inactive gas source 602 through a flow restrictor capillary 604 and a gas valve 606 to a flow space 29 between the first inner tube 27 and the first outer tube 28. The inset shows a cross-section of the injector 22 along lines Y-Y and illustrates the position of the flow space 29 between the first inner tube 27 and the first outer tube 28. A booster valve 608 is kept closed. The inactive gas flows 302 towards a gas diffusion barrier area that is located near the tip 304 of the first inner tube 28. Near the tip 304 the inactive gas flow is divided into two parts. The first part of the divided inactive gas flow continues 308 along the first outer tube 28 and exits the first outer tube 28 through apertures 30 to the reaction chamber. The second part of the divided inactive gas flow turns to the inside of the first inner tube 27 and flows 306 towards the exhaust line 620. The exhaust line 620 has a flow restriction capillary 612 for limiting the flow rate of gases towards the vacuum pump 58 and a valve 614 for closing the exhaust line 620 when needed. The exhaust valve 614 is kept open during the purge step.

Figure 6:
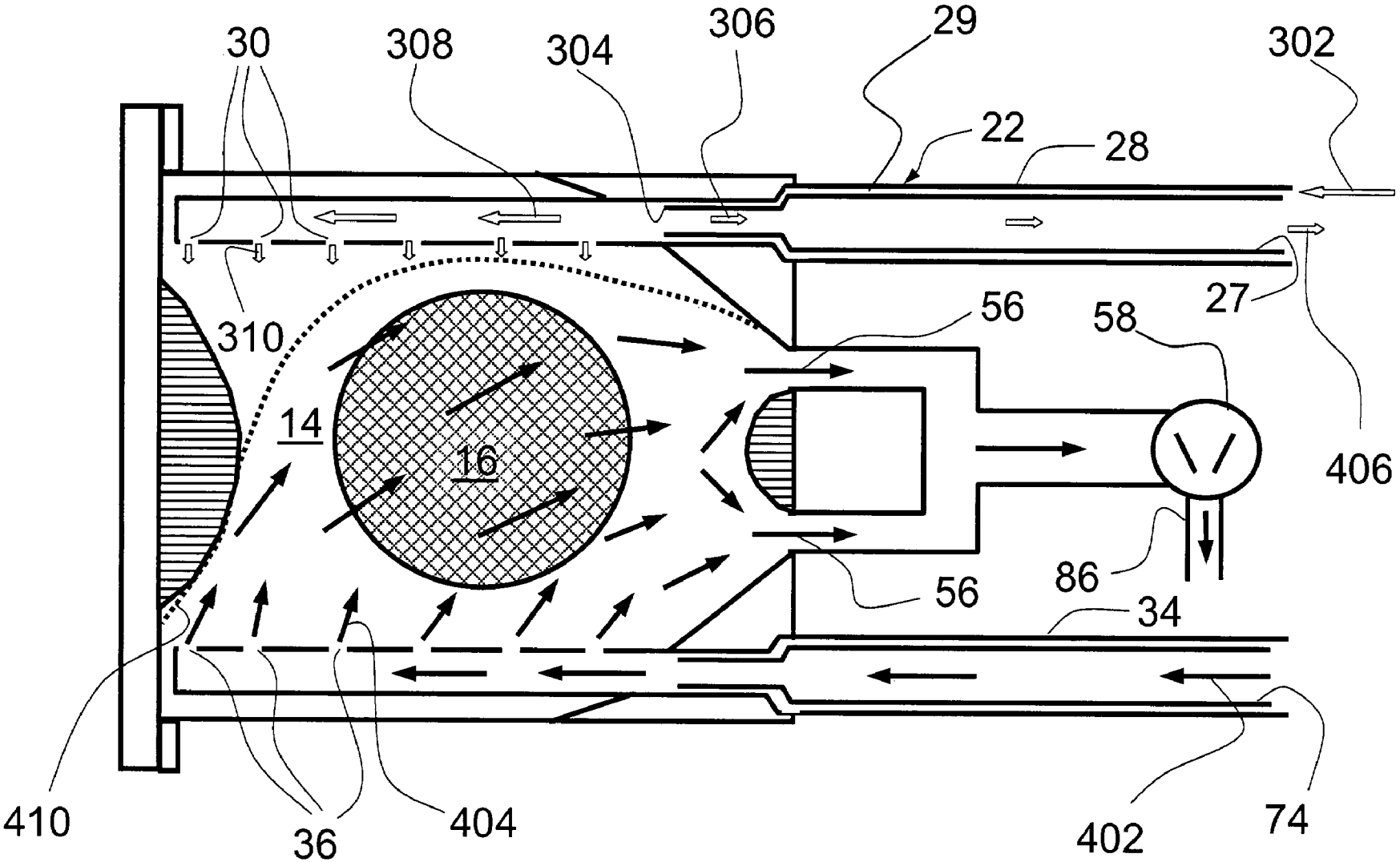

FIG. 6 is the schematic top view of an ALD reactor as depicted in FIG. 1 showing a gas flow pattern during a second precursor B pulse. Inactive purging gas flows through the first gas inlet 22 that includes the first inner tube 27 and the first outer tube 28, the same way as in FIG. 4. The second gas inlet 24, including the second inner tube 74 and the second outer tube 34, allows second precursor B to travel 402 from a second precursor B supply source (not shown) through the second inner tube 74, through the second outer tube 34, through the apertures 36 and into the reaction space 14. The surface area exposed to the second precursor B pulse is restricted to a certain area 410 within the reaction chamber by the opposing flow 310 of the inactive purging gas that is coming out of the apertures 30 of the first outer tube 28. The exposure restriction is beneficial for preventing thin film growth on the surface of the first outer tube 28. The gas injection structure stays clean for a long time. In addition, the formation of particles is suppressed because thin film does not accumulate on surfaces near the gas injection structure.

Figure 7:
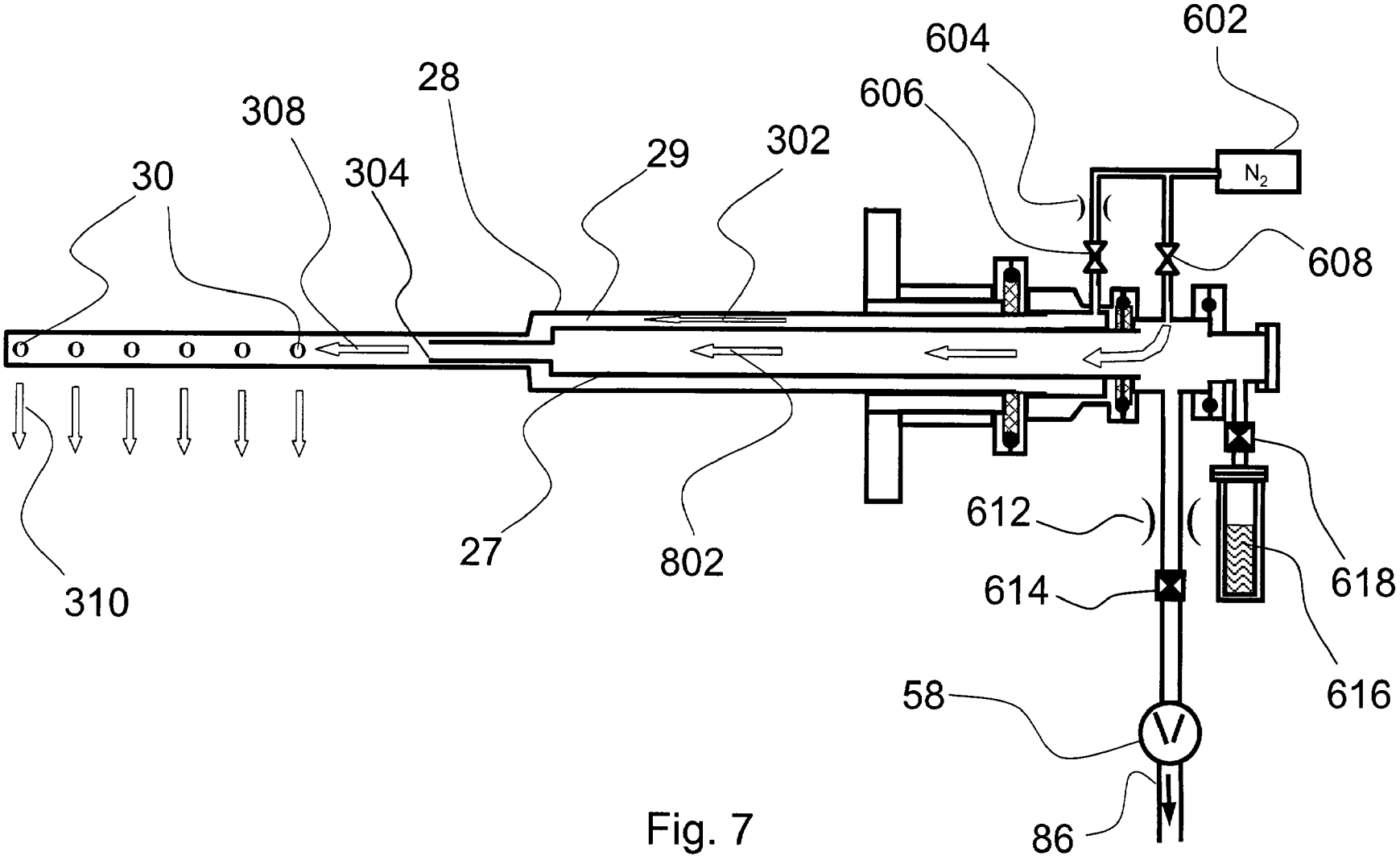

FIG. 7 is a schematic cross-sectional side view of the reactant in-feed system and gas flow pattern during a booster step. After each reactant pulse step, a booster purge step may be added to quickly push the reactant vapor from the gas inlet into the reaction chamber. The booster step is optional and can be eliminated from the pulsing sequence if it is not needed. In that case a six-step pulsing sequence of first reactant A pulse/booster purge A/purge A/second reactant B pulse/booster purge B/purge B is reduced into a normal four-step pulsing sequence of first reactant A pulse/purge A/second reactant B pulse/purge B.

When the booster purge step is executed, the source control valve 618 and the source exhaust valve 614 are closed. Then the purge gas valve 606 is opened to allow purge flow 302 through the purge channel 29 and booster valve 608 is opened to allow purge flow 802 through the reactant channel defined by the inner tube 27. Vapor of the first reactant vapor A is pushed away from the first inner tube 27, through the first outer tube 28 and through the apertures 30 into the reaction space. It can be understood that the booster step removes most of the first precursor A vapor from the gas inlet so that the following purge pulse only needs to transport the residual first precursor A vapor from the space between the tip 30 of the first inner tube 27 and the apertures 30 of the first outer tube 28 into the reaction chamber and further to the outlet of the reaction chamber. The booster purge (arrows 802 in FIG. 7) pushes quickly most of the remaining precursor molecules from the inner tube 27 (FIG. 7) and from the inert gas valving area (near point 304 in FIG. 7) to the reaction space. The booster purge pulse empties the gas injector from the precursor molecules more quickly than would the inert gas flow during inert gas valving. Inert gas valving is not operational during the booster purge pulse. Inert gas valving starts to operate after the booster purge and ensures that residual precursor molecules cannot escape from the inner tube towards the reaction space.

Use of the booster step is not limited to the injection structures disclosed herein. The booster step is particularly preferred for valving arrangements that include inert gas valving, in which inert gas walls or diffusion barriers are typically employed for switching flow within the hot zone of the ALD reactor, in place of physical valves. As is known in the art, inert gas valving can be employed by switching inactive gas flow from a carrier gas path, leading through a reactant source (e.g., bubbler) to the reaction chamber, to a by-pass path that rejoins the carrier gas path upstream of the reaction chamber but downstream of the reactant source. The inactive gas flow then splits to partially flow downstream into the reaction chamber and partially upstream a short distance toward the reactant source. The upstream flow is typically diverted through a back-suction line leading to a vacuum source. The section of line between the reaction chamber and the reactant source that is filled within inert gas is referred to as an inert gas diffusion barrier. The booster purge step advantageously clears the inert gas barrier of reactant prior to the second or main purge pulse. Tuomo Suntola has presented an informative theoretical background about inert gas valving. See T. Suntola, Handbook of Crystal Growth 3, Thin Films and Epitaxy, Part B: Growth Mechanisms and Dynamics, Chapter 14, Atomic Layer Epitaxy, edited by D. T. J. Hurle, Elsevier Science B.V., 1994, pp. 601-663, the disclosure of which is incorporated herein by reference. See especially pp. 624-626.

Figure 8:
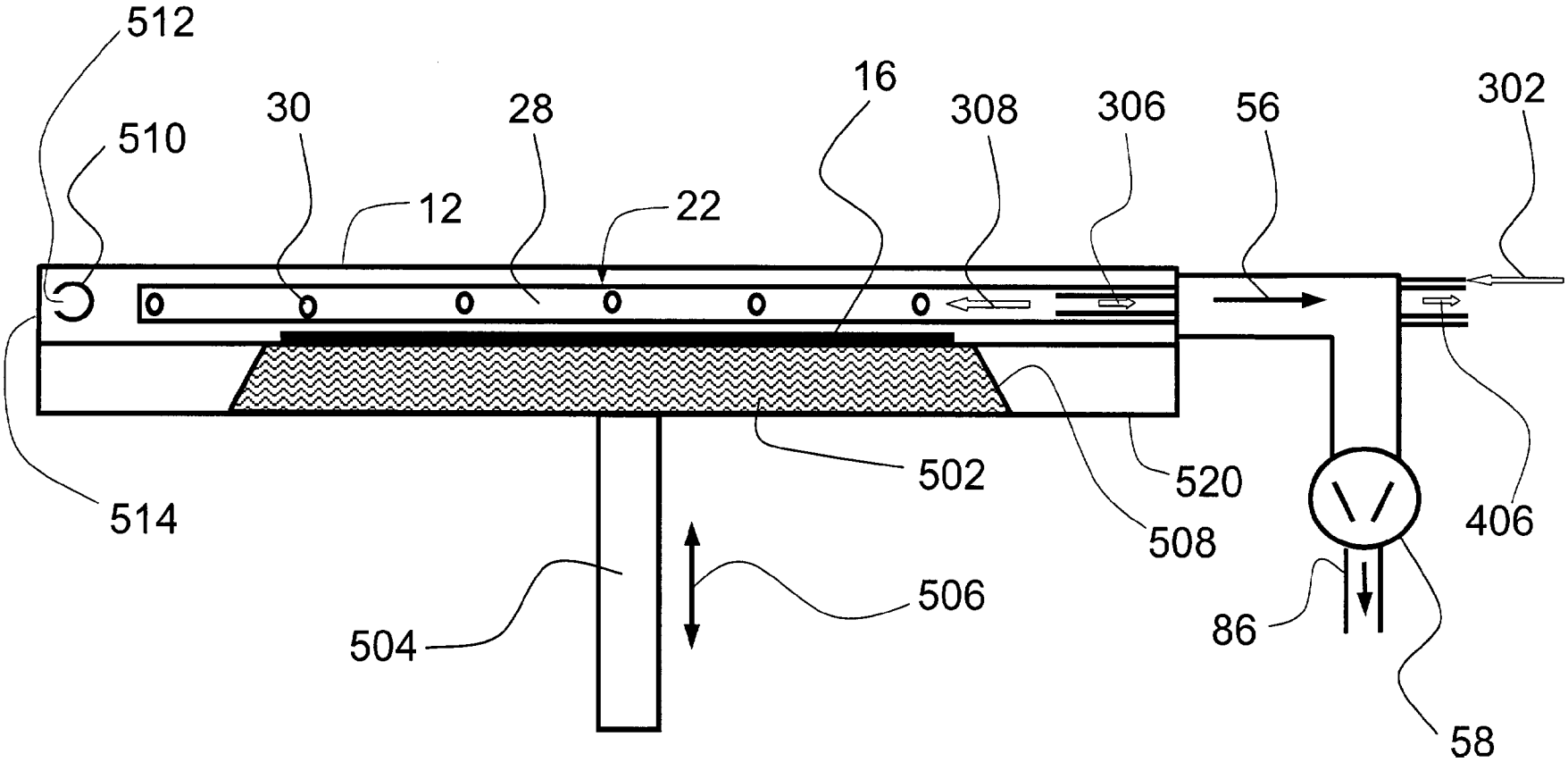

FIG. 8 shows a schematic cross-sectional side view of another embodiment of the invention. The first gas inlet or injector 22 and the second gas inlet (not shown in this view) are arranged relative to the substrate 16 the same way as in FIGS. 1 and 4. The flow pattern modifier 50 opposite the exhaust 56 in FIGS. 1 and 4 is replaced with a third-gas inlet 510 that has apertures 512. The apertures 512 of the third gas inlet or injector can be aligned towards an end wall 514 of the reaction chamber 12, as shown. One benefit of this type of alignment is that stagnant flow spaces that possibly exist between the third gas inlet 510 and the end wall 514 of the reaction chamber are eliminated. The third gas inlet 510 can be used for supplying a third precursor C into the reaction chamber 12 or it can be used for supplying inactive purge gas into the reaction chamber 12. One benefit of the third gas inlet, regardless of whether a third reactant is employed, is that it enhances the purging of the reaction chamber 12. During purge pulses, inactive gas coming out of the apertures 512 helps to push residual first precursor A or second precursor B out of the reaction chamber 12 into the exhaust line 56.

During the deposition process the substrate 16 is resting on a heated susceptor plate or pedestal 502 that is sealed 508 against a base plate 520 of the reaction chamber 12. The pedestal 502 can be raised or lowered 506 by a piston 504.

Figure 9:
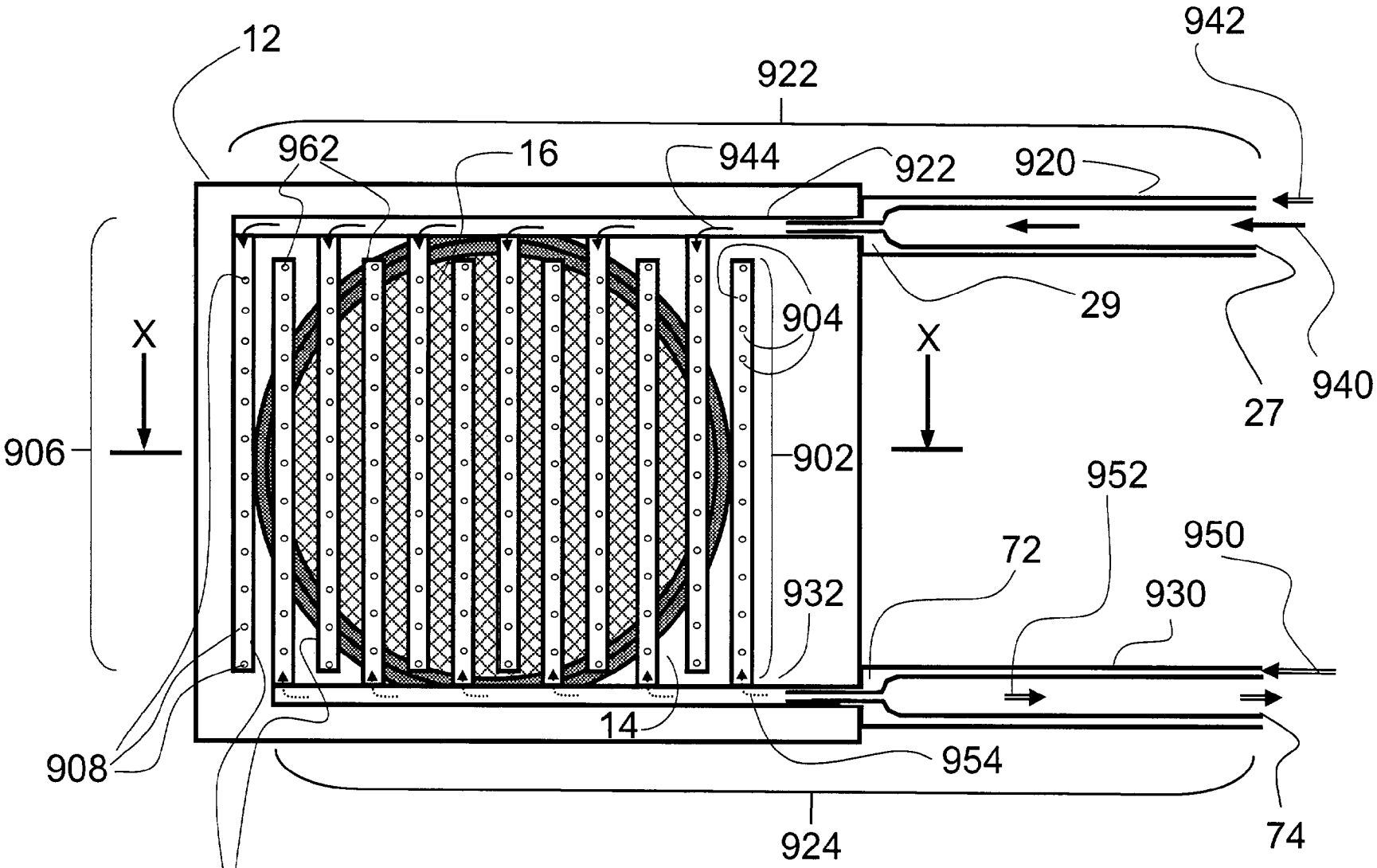

FIG. 9 is a schematic top view of an ALD reactor according to another embodiment of the invention. The gas injectors of the illustrated embodiment form a showerhead rake structure that includes a first showerhead rake 906 and a second showerhead rake 902. The first gas injector includes a first showerhead rake 906 in fluid communication with a first gas inlet 922, including a distribution structure. In the illustrated embodiment, the distribution structure comprises a distributor section similar to that of FIG. 1. Rather than opening directly into the reaction space 14, however, the distributor section of the first gas inlet 922 opens into branching hollow tubes or fingers, as described below. The first gas inlet 922 allows a first precursor A and/or purge gas to travel from a first precursor A supply source (not shown) and/or a purge gas source (not shown) into the reaction space 14 through the first showerhead rake 906.

While illustrated as branching from distributor tubes within the reaction space, it will be understood that, in other arrangements, the hollow tubes or fingers can branch or extend from other distribution structures. For example, the fingers may separately connect to openings of a gas distribution manifold that is integrated with the reaction chamber walls. Thus, the first gas inlet 922 may be connected to the supply sources via a single distribution tube, as shown, or via multiple tubes. Each connection can be a tolerance fitting, o-ring seal, axial shaft seal, or any other method of connection known by those skilled in the art.

The second gas injector includes a showerhead rake 902 in fluid communication with a second gas inlet 924, also including a distributor section that opens into branching tubes or fingers (see below). The second gas inlet 924 allows a second precursor B and/or purge gas to travel from a second precursor B supply source (not shown) and/or purge gas supply source (not shown) into the reaction space 14 through the second showerhead rake 902. The second gas inlet 924 is in fluid communication with a second precursor B gas source (not shown) and the purge gas supply source (not shown) and may be connected to the supply sources as described above with respect to the first gas inlet.

As depicted in the illustration, the first gas inlet 922 includes a first outer tube 920 that is in fluid communication with each of a first set of hollow fingers 960 such that when the first precursor A flows through the first outer tube 920, it flows 944 to each finger 960 and is dispersed out each finger 960 by a plurality of apertures 908 located on the fingers 960. The apertures can face away from the substrate 16 in some arrangements, but preferably face the substrate 16. Similarly, the second gas inlet 924 includes a second outer tube 930 that is in fluid communication with a second set of hollow fingers 962 such that when the second precursor B flows through the second outer tube 930, it flows 954 to each finger 962 and is dispersed out each finger by a plurality of apertures 904 located on the fingers 962. The apertures 908, 904 are positioned and configured to cause the gas that flows out of them to contact the wafer or substrate 16 below and rapidly diffuse across the gaps between apertures of the same rake 902, 906. The apertures 908, 904 are spaced on each finger 960, 962 so that the distance between the apertures along each finger 960, 962 is preferably on the order of about 5-30 mm. The diameter of the apertures 908, 904 is preferably in the range of about 1-5 mm. As shown in FIG. 9, the fingers 960 of the first showerhead rake 906 are interspersed with the fingers 962 of the second showerhead rake 902 so that the interspersed fingers positionally alternate or stagger between a first rake finger and a second rake finger across an injection plane adjacent the substrate 16.

As discussed above, a typical pulsing cycle for an ALD process includes four basic steps: first precursor A pulse, inactive gas purge (or other removal step), second precursor B pulse and inactive gas purge (or other removal step). While the first showerhead rake 906 is used for distributing the first precursor A vapor over the substrate 16, the second showerhead rake 902 is filled with flowing a low level of inactive purge gas. Inactive purge gas 950 flows first through the space between the second inner tube 74 and the second outer tube 930, then through the section of the second outer tube 930 that is in fluid communication with the second set of hollow fingers 962 so that the flow 954 is divided between the fingers 962 and then through the apertures 904 that are spaced along the fingers 962. The inactive purge gas flow ensures that the first precursor A flow cannot enter the hollow fingers 962 through the apertures 904. As shown, the second gas inlet 924 is configured such that some of the inactive gas flows 952 backward into the second inner tube 74. However, the level of inactive gas flow through the second showerhead rake 902 is low enough to allow first precursor from the apertures of the first showerhead rake 906 to readily diffuse across the substrate 16, filling in gaps between the apertures 904. This arrangement is in contrast to conventional flow-through systems (whether laminar or showerhead), in which carrier gas tends to lead a large part of precursor straight to the exhaust, or opposite channel feeds that provide purge gas flow one side of the substrate while reactant flows from the other side. In either case, reactant is not permitted to diffuse evenly to all surfaces of the substrate.

Thus, during the first precursor A pulse the first precursor A gas flows 940 through the first showerhead rake 906 of the first injector and inactive purge gas flows through the second showerhead rake 902 of the second injector. During the inactive gas purge step, inactive purge gas preferably flows though both the first showerhead rake 906 and the second showerhead rake 902, preferably at an increased flow rate relative to the trickle flows during precursor steps. During the second precursor B pulse the second precursor B vapor flows though the second showerhead rake 902 and inactive purge gas flows (at a lower flow rate than during purge steps) through the first showerhead rake 906.

Figure 10:
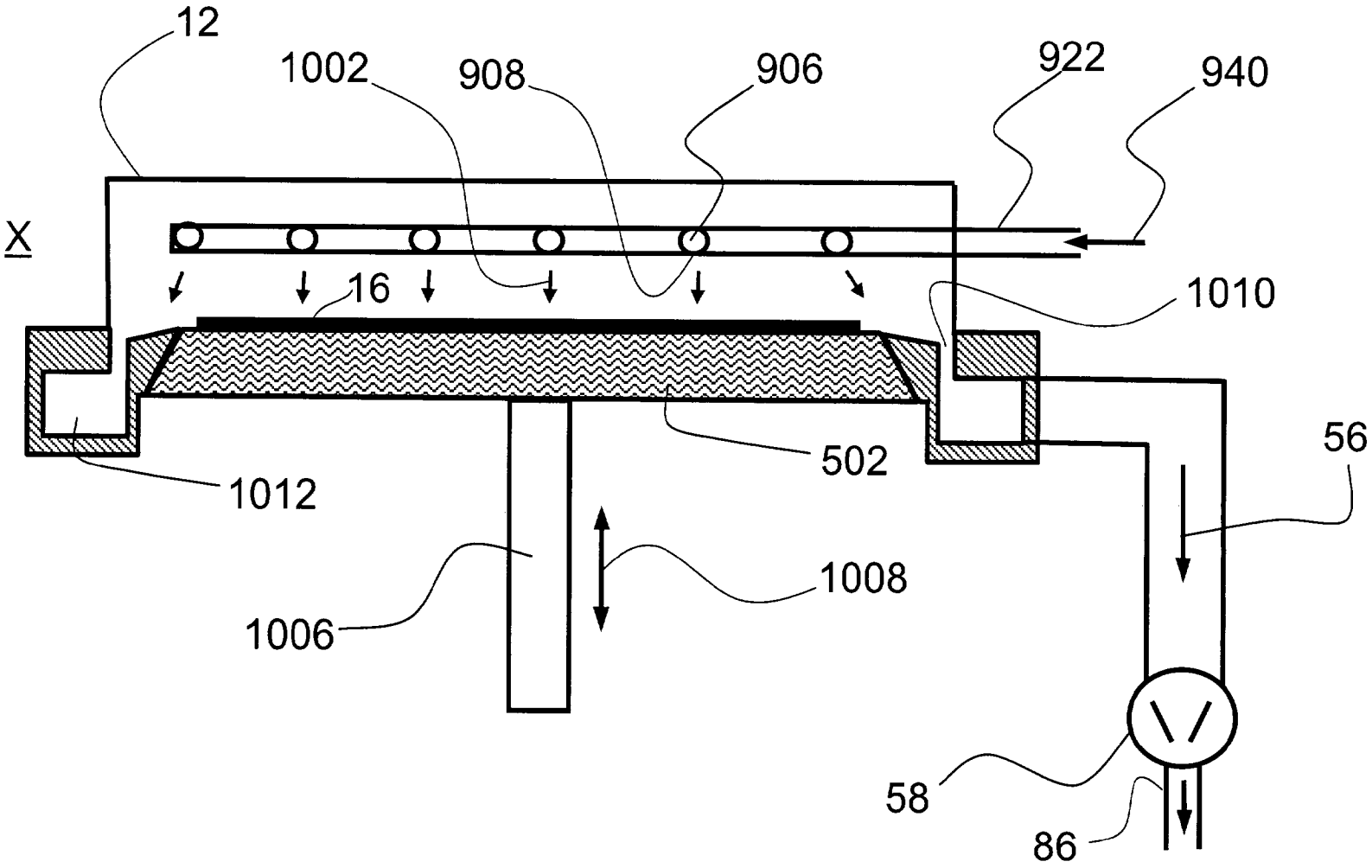

FIG. 10 is a schematic cross-sectional view of the ALD reactor as depicted in FIG. 9. Only the cross section of the first showerhead rake 906 is shown. Excess first precursor A, second precursor B and/or purge gases may be removed from the reaction space via a vacuum, a simple outlet or through an exhaust that employs a reduction in pressure between the chamber and an outer environment, causing the gas in the reaction chamber to escape into the outer environment. According to one embodiment presented in FIG. 10, gases are expelled from the reaction chamber 12 through a flow restrictor channel 1010 that is annular or ring-shaped, a collector space which is also annular and is in fluid communication with the flow restrictor channel, and an exhaust duct 56 that is in fluid communication with the collector space 1012. Those skilled in the art will appreciate that the flow restrictor channel and collector space can also be oval-shaped, square shaped or any other shape. The exhaust duct 56 guides the gases to a vacuum pump 58 that creates a pressure gradient to the volume between the reaction chamber 12 and the vacuum pump 58. Gases flow from a higher pressure space to a lower pressure space along the pressure gradient.

FIG. 10 also shows the substrate 16 supported upon a heated susceptor plate or pedestal 502, which can be raised or lowered 1008 by a piston 1006 to open the reaction chamber 12 and allow a transfer mechanism (not shown) to load or unload the substrate 16.

Figure 11:
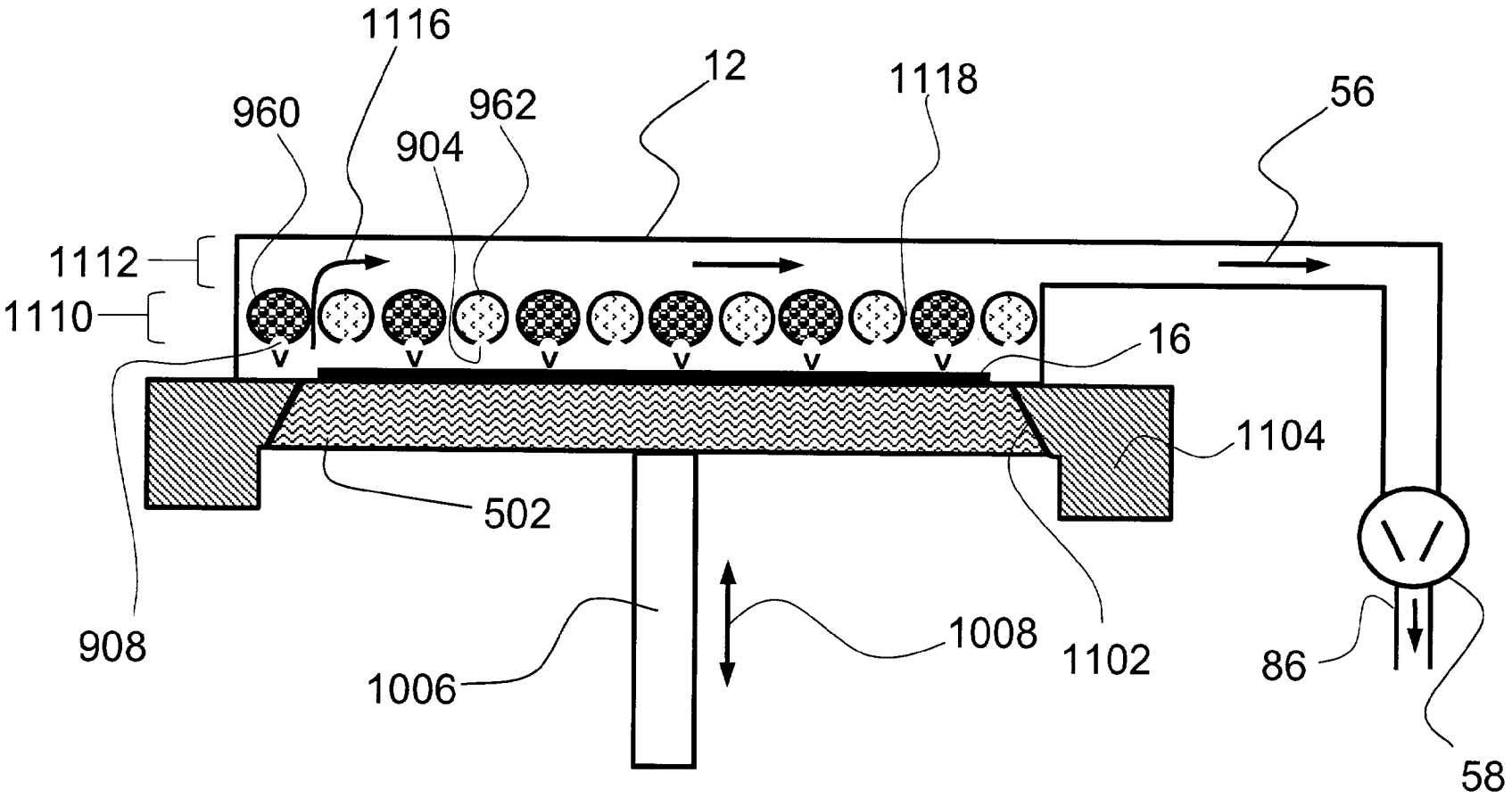

FIG. 11 shows a schematic cross-sectional view of an ALD reactor according to still another embodiment of the invention. A first showerhead rake includes precursor A fingers 960 that are hollow tubes having multiple apertures 908. A second showerhead rake consists of precursor B fingers 962 that are hollow tubes having multiple apertures 904. The first and the second showerhead rakes define a showerhead rake or injection plane 1110 that is located above the substrate 16, preferably about 5-50 mm from the substrate 16 surface. The distance between the first precursor A fingers 960 and the second precursor B fingers 962 is preferably about 1-50 mm, more preferably about 5-15 mm. The diameter of the finger tubes is preferably about 6-30 mm. The number of fingers depends on the dimensions of the substrate and the distance between the fingers. A gas flow space 1112 above the showerhead rake plane 1110 is sufficiently high to enable high gas flow conductivity. The height of the gas flow space 1112 is preferably about 20-100 mm, more preferably about 30-60 mm. Advantageously, exhaust flow 1116 can escape through spaces 1118 between adjacent fingers, through the injection plane 1110.

As shown in FIG. 11, a substrate 16 is placed on a heated susceptor plate or pedestal 502. The susceptor plate 502 is lifted 1008 upwards until a contact surface 1102 is created between the susceptor plate 502 and the base plate 1104 of the reaction chamber 12. Inert gas flow is switched on to the first precursor A fingers 960 and the second precursor B fingers 962. The temperature of the substrate is allowed to stabilize for a period of time. After the substrate temperature has stabilized the deposition of a thin film starts. The first step is to pulse the first precursor A to the reaction space. The first precursor A flow is switched on so that the first precursor A gas with or without inactive carrier gas is flowing out of the apertures 908 of the first precursor A fingers 960. At the same time some inactive purge gas flows at a low or trickle rate out of the apertures 904 of the second precursor B fingers 962. The purpose of the inactive purge gas flow is to prevent the apertures 904 of the second precursor B fingers 962 from any exposure to the first precursor A molecules, but the trickle rate of purge flow preferably does not interfere with the diffusion of precursor A across the substrate.

After the first reactant A is pulsed, the flow of the first precursor A gas is switched off and the reaction space is evacuated from the excess first reactant A and possible reaction byproducts. Inactive purge gas flows out of the apertures 908 and 904 at a higher flow rate than during precursor steps, while a vacuum pump 58 removes gases from the reaction chamber 12.

When the pulsing sequence has proceeded to the second precursor B pulse, the second precursor B flow is switched on so that the second precursor B gas with or without inactive carrier gas is flowing out of the apertures 908 of the second precursor B fingers 962, while inactive purge gas is flowing at a low rate out of the apertures 904 of the first precursor A fingers 960 and protecting the apertures 904 of the first precursor A fingers 960 against any exposure to the second precursor B molecules. The inner surfaces of the fingers 962 and 960 and related apertures 908 and 904 stay clean and remain free of particles, but the trickle rate of purge flow preferably does not interfere with the diffusion of precursor B across the substrate.

After the second reactant B is pulsed, the flow of the second precursor B gas is switched off and the reaction space is evacuated of the excess second reactant B and possible reaction byproducts. Inactive purge gas flows out of the apertures 904 and 908 at a higher rate than during the precursor steps while a vacuum pump 58 removes gases from the reaction chamber 12.

Figure 12:
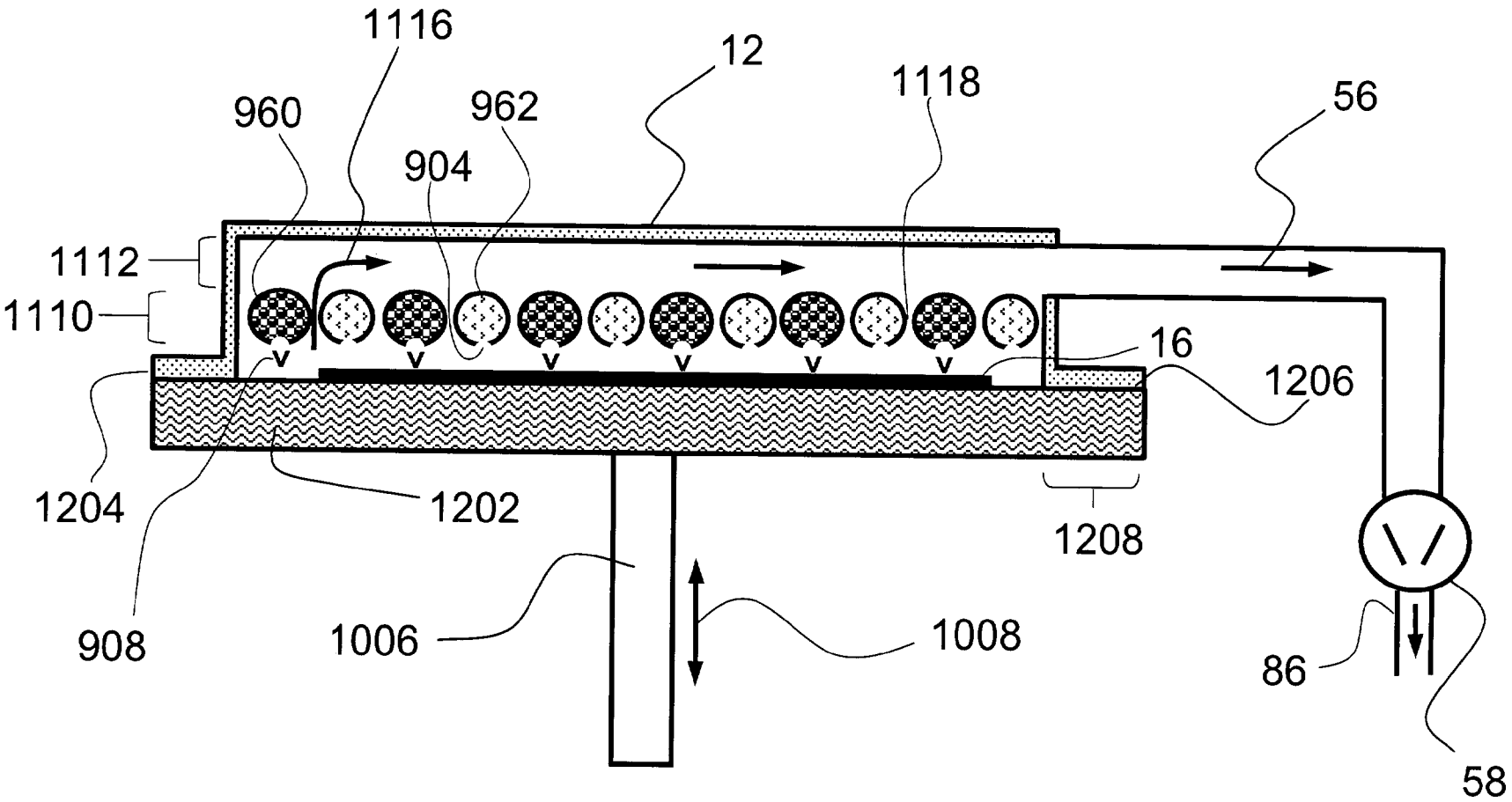

FIG. 12 shows a schematic cross-sectional view of an ALD reactor as depicted in FIG. 11 with another type of reaction chamber sealing system. The susceptor plate 1202 is lifted 1008 upwards until contact is made against the reaction chamber 12 so that a contact surface 1206 seals the reaction chamber space from the surrounding gas space. The sealing length 1208 in the contact surface 1206 is preferably about 20-80 mm, more preferably about 40-60 mm.

Figure 13A:
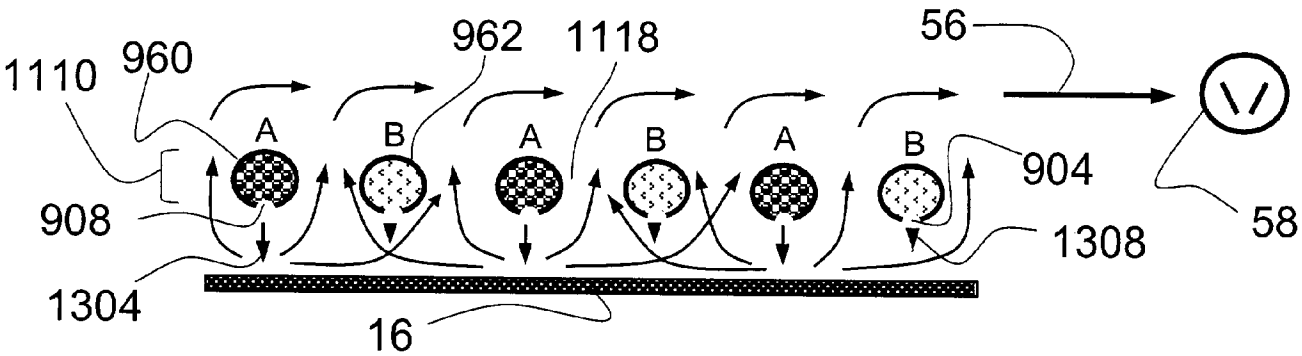
FIGS. 13a, 13b and 13c are schematic cross sectional views of gas flow geometry near the substrate in the ALD reactor of FIG. 11.
Figure 13B:
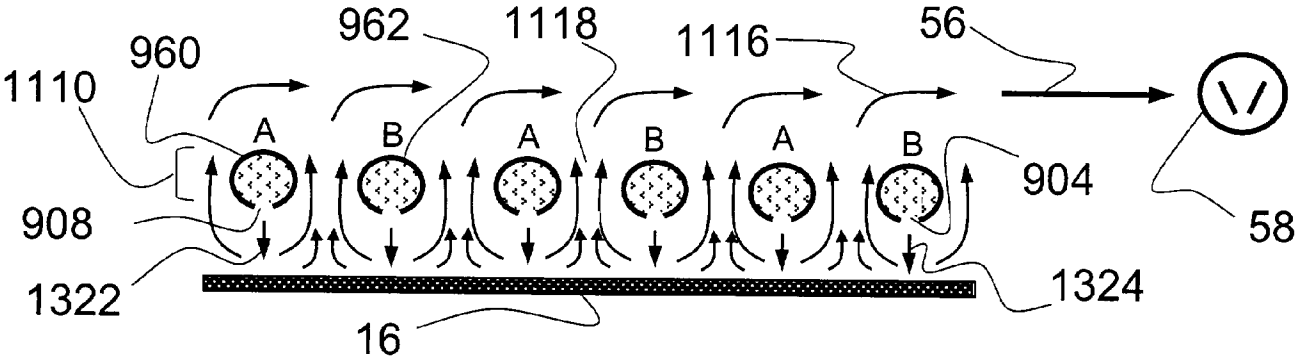
Figure 13C:
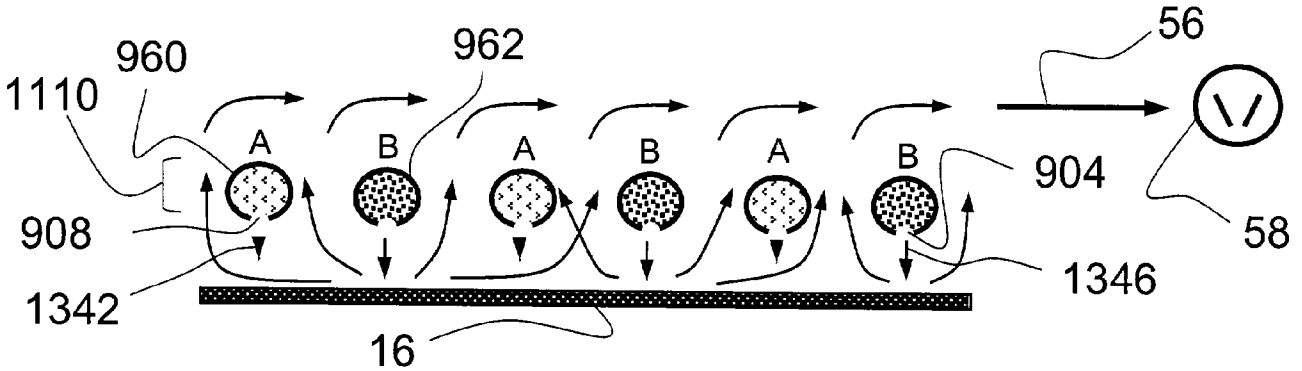

FIGS. 13a, 13b and 13c show schematic cross sectional views of gas flow geometry near a substrate 16 in an ALD reactor with dynamic pressure control of the reaction space. As discussed in detail below, the purge gas flow may be modulated by dynamic pressure control. A first showerhead rake includes precursor A fingers 960 that are hollow tubes having multiple apertures 908. A second showerhead rake includes precursor B fingers 962 that are hollow tubes having multiple apertures 904. The first and the second showerhead rake define an injection plane 1110 that is located over the substrate 16 preferably about 5-50 mm from the substrate 16 surface. The distance between the first precursor A fingers 960 and the second precursor B fingers 962 is preferably about 1-50 mm, more preferably about 5-15 mm. The number of fingers depends on the dimensions of the substrate and the distance between the fingers.

FIG. 13a shows the deposition sequence in a precursor A pulse step. The flow rate of inactive purge gas through the apertures 904 of the second precursor B fingers 962 is low enough that the inactive gas flow 1308 does not shield the substrate surface below the second precursor B fingers 962 against the exposure to the precursor A molecules. On the other hand, the flow rate of inactive purge gas 1308 through the apertures 904 of the second precursor B fingers 962 is high enough to keep the first precursor A molecules from entering the apertures 904 of the second precursor B fingers. The flow rate ratio of the inactive gas is for example about 1:10, so that during precursor A pulse the flow rate of the inactive purge gas 1308 is 1 unit and during the following purging step 10 units. The first precursor A gas flows 1304 out of the apertures 908 of the first precursor A fingers 960 first towards the substrate 16 and then the gas spreads laterally over the substrate 16 surface. Gradually the flow direction of the first precursor A gases changes away from the substrate 16 surface and the gases flow through the showerhead rake or injection plane 1110 in the spaces between alternated fingers towards the exhaust 56 and the vacuum pump 58.

FIG. 13b shows the deposition sequence in a purging step. Inactive gas is flowing through both the apertures 908 of the first precursor. A fingers 960 and apertures 904 of the second precursor fingers 962. When the inactive purge gas has exited 1322, 1324 the apertures 908 and 904, respectively, the gas molecules first flow towards the substrate 16. Then the flow direction of gases gradually changes by about 180 degrees and the gases flow through the showerhead rake or injection plane 1110 in the spaces 1118 between the rake fingers 960 and 962. After passing through the showerhead rake plane 1110 the flow direction 1116 gradually changes towards the exhaust 56 and the gases flow to the vacuum pump 58.

FIG. 13c shows the deposition sequence in a precursor B pulse step. The flow rate of inactive purge gas through the apertures 908 of the first precursor A fingers 960 is low enough so that the inactive gas flow 1342 does not shield the substrate surface below the first precursor A fingers 960 against the exposure to the precursor B molecules. On the other hand, the flow rate of inactive purge gas 1346 through the apertures 908 of the first precursor A fingers 960 is high enough to keep the second precursor B molecules away from the inside and the apertures 908 of the first precursor A fingers 960. For example, the flow rate of the inactive purge gas is lowered from 10 units that was used during purge step in FIGS. 13b to 1 unit during the precursor B pulse step in FIG. 13c. The second precursor B gas flows 1346 out of the apertures 904 of the second precursor B fingers 962 first towards the substrate 16 and then the gas spreads laterally over the substrate 16 surface. Gradually the flow direction of the second precursor B gases changes away from the substrate 16 surface and the gases flow through the showerhead rake or injection plane 1110 towards the exhaust 56 and vacuum pump 58.

After the precursor B pulse step the deposition system proceeds to a purging step as shown in FIG. 13b. The pulsing sequence of these four deposition steps are repeated as many times as is needed for growing a thin film of desired thickness. Each pulsing sequence typically adds about 0.2-1 Å to the film thickness, depending on the precursors and deposition process.

As mentioned above, the purge gas flow may be modulated by dynamic pressure control of the reaction space. To do so, the reaction space pressure is first kept at a low level, for example, at a pressure range of approximately 0.1-1 mbar. Low reaction space pressure causes faster distribution of the precursor molecules, particularly when the precursor molecules are provided from a higher pressure source, because the diffusion rate of molecules increases.

The precursor doses may be divided into multiple short pulses, which can improve the distribution of the precursor molecules into the reaction chamber. Just before switching on the precursor pulse the pressure of the reaction space is approximately at 0.1-1 mbar. The first short precursor pulse increases the reaction space pressure temporarily to a higher level, for example, at a range of approximately 3-10 mbar. The short precursor pulse lasts for approximately 0.04-0.10 seconds. Then the precursor pulse is switched off for about 0.04-0.50 seconds. Gases flow to the gas outlet and the pressure of the reaction space decreases again to the low level.

The switch-on and switch-off stages are repeated at least two times. As a result, the pressure of the reaction space fluctuates rapidly between the low level and higher level pressure. The resulting pressure gradient in the reaction space during the switch-on stage pushes the precursor molecules efficiently to all areas of the reaction space, while the resulting pressure gradient in the reaction space during the switch-off stage pulls gaseous reaction by-products away from the surfaces of the reaction space to the gas outlet. If a conventional, relatively long pulse (e.g., 1 second) is released to the reaction chamber, the pressure is allowed to equalize, such that dynamic spreading effect is lost and the main part of the gas flow tends to head directly to the gas outlet. When several short pulses (e.g., 3 times 0.3 seconds) are released, a much more even distribution is achieved in a similar time period.

Controlling the evacuation speed with variable evacuation capacity is optional, because it is more convenient to carry out the dynamic pressure control with inactive gas valves 606, 608 and source valve 618 at the gas inlet or with a mass flow controller connected between the inactive gas source 602 and the inactive gas valves 606, 608 (see FIG. 3, 5 or 7). Another possibility is to replace the inactive gas valves 606, 608 with a sensitive mass flow controller. MicroFlo™, available from Pneucleus Technologies, LLC, 169 Depot Road, Hollis, N.H., USA, is provided as an example of a mass flow controller that is sensitive enough to control sub—0.10 second pulses. The MicroFlo™ controller has a response time of about 0.04 s (within 1% of the flow set point).

The purge gas flow may also be divided into multiple short pulses that can last for approximately 0.04-0.50 seconds each, preferably between about 2 to 6 pulses per purge step, more preferably between about 2 to 4 pulses per purge step. During the multiple short pulses, pressure in the reaction space fluctuates between the low level and the high level. Switching on the purge flow increases the pressure of the reaction space to the high level, while switching off the purge flow decreases the pressure of the reaction space to low level. The flow rate of the switch-off purge flow may be lowered, for example, to 10% of the switch-on purge flow. In that case the flow rate changes rapidly by one order of magnitude between high flow rate level (e.g., 200 std. $cm^3$/min or sccm) and low flow rate level (e.g., 20 sccm). Pressure gradients inside the reaction space push inactive gas molecules towards the surfaces during the switch-on stage and pull the gas molecules away from the surfaces during the switch-off stage.

Thus, each precursor and purge pulse may consist of multiple switch-on and switch-off stages. Local pressure gradients enhance the exchange of gases in the reaction space and enhance the exchange of molecules between the substrate surface and the gas phase of the reaction space. It has been found that multiple pulses of the same gas per step, whether purge step or reactant step, is particularly advantageous when depositing on wafers with high aspect ratio features, such as deep, narrow trenches or vias in semiconductor substrates. Thus, the process of multiple same-gas pulses in a row, and the consequent pressure fluctuations, are particularly advantageous for deposition inside vias and trenches of greater than 20:1 aspect ratio, and more particularly greater than 40:1 aspect ratio. The pressure fluctuations enable saturation of the surfaces within such vias and trenches in less overall time than a single prolonged pulse. Thus, overall cycle time is reduced.

Figure 14:
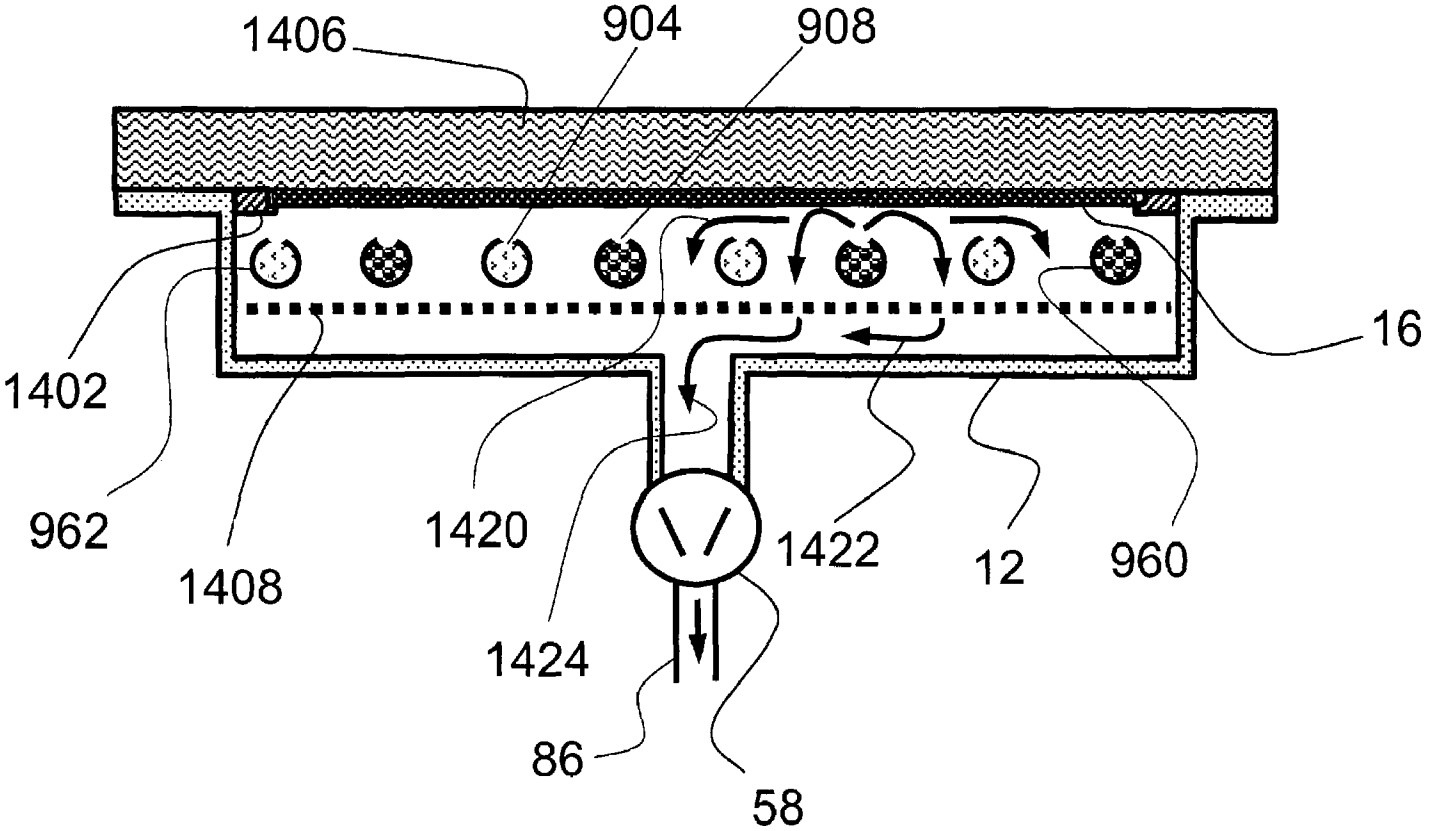

FIG. 14 shows yet another embodiment of the invention. A wafer or substrate 16 is positioned within an upper part of a reaction chamber 12 so that the deposition surface faces down towards the reaction space. As shown in this embodiment, a wafer holder 1402 secures the wafer or substrate 16 above gas injector tubes or fingers 960, 962. A heating plate 1406 may be positioned over the substrate 16. According to another embodiment the heating plate 1406 is replaced with a radiative heater (not shown) that is located above the substrate 16 and the substrate is heated with thermal radiation or visible light from the backside, preferably through a transparent window. When gases are dispersed from the apertures 904, 908 of the gas inlet tubes, the gases first flow up towards the wafer or substrate 16, then the flow direction 1420 of the gases gradually changes so that the flow direction finally points towards a flow restrictor grid 1408. After flowing through the flow restrictor grid 1408, the gases will flow 1422 towards an exhaust duct 1424 that guides the gases to a vacuum pump 58. According to the embodiments, the evacuation of gases from the vacuum chamber 12 is carried out with a vacuum pump, a simple venturi outlet or any other means that result in a reduction in pressure from the chamber to an outer environment causing the gas in the reaction chamber to escape to the outer environment. It will be appreciated that the flow restriction grid 1408 can also be employed between the gas inlets and exhaust of previously described embodiments.

Figure 15:
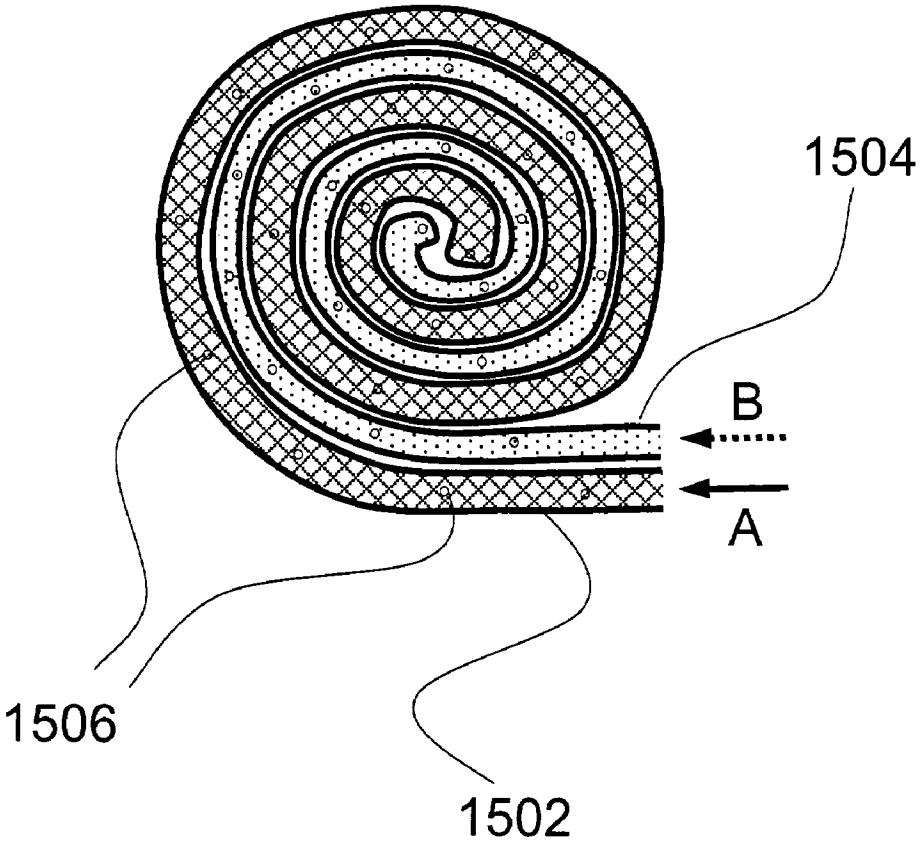

FIG. 15 shows a gas injection structure in accordance with another embodiment, that includes a dual spiral showerhead that consists of a spiral tube 1502 for a precursor A and a spiral tube 1504 for a precursor B. Spirals are made, for example, of hollow silica or metal tubes. Apertures 1506 are arranged on the spirals so that the distance between the apertures is preferably about 5-50 mm. The dual spiral showerhead can be placed next to a wafer in a similar position as showerhead rakes were placed in FIG. 9. Apertures 1506 are pointing towards a substrate or a wafer or away from a substrate or a wafer. Precursor pulses can be alternated, with intervening purge steps, as described above with respect to previous embodiments. Advantageously, spaces between the spiral tubes 1502 and 1504 enable exhaust flow through the plane of the injectors for embodiments in which the dual spiral showerhead intervenes between the plane of the substrate or wafer and the plane of the exhaust. Such an arrangement, as noted elsewhere herein, facilitates purge pulses sweeping all gas away from the substrate by rapid diffusion across the substrate. before being lifted away from the substrate (rather than flowing across the substrate in a defined path in route to the exhaust).

Figure 16B:
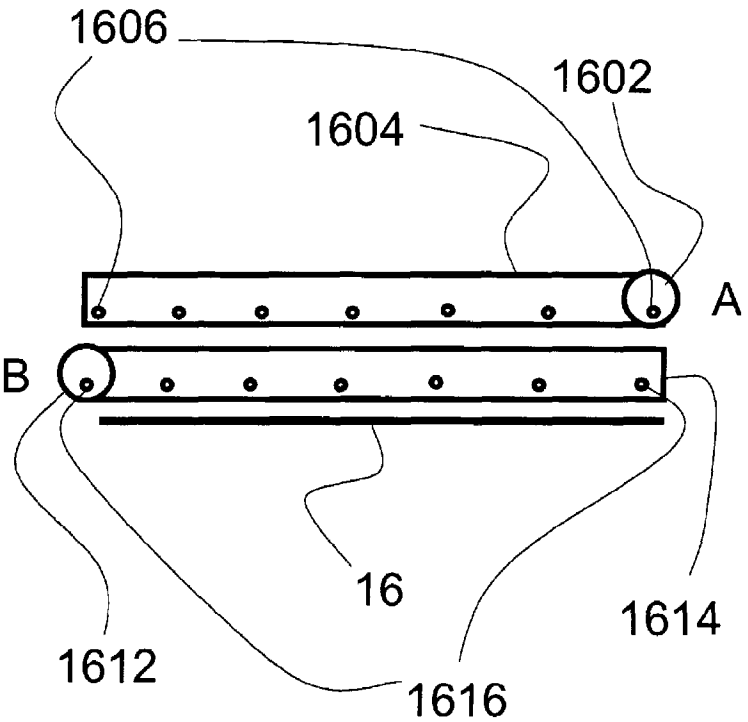
FIGS. 16a and 16b are schematic top down and end views, respectively, of shower tubes constructed in accordance with another embodiment of the invention, shown in relation to a substrate.
Figure 16A:
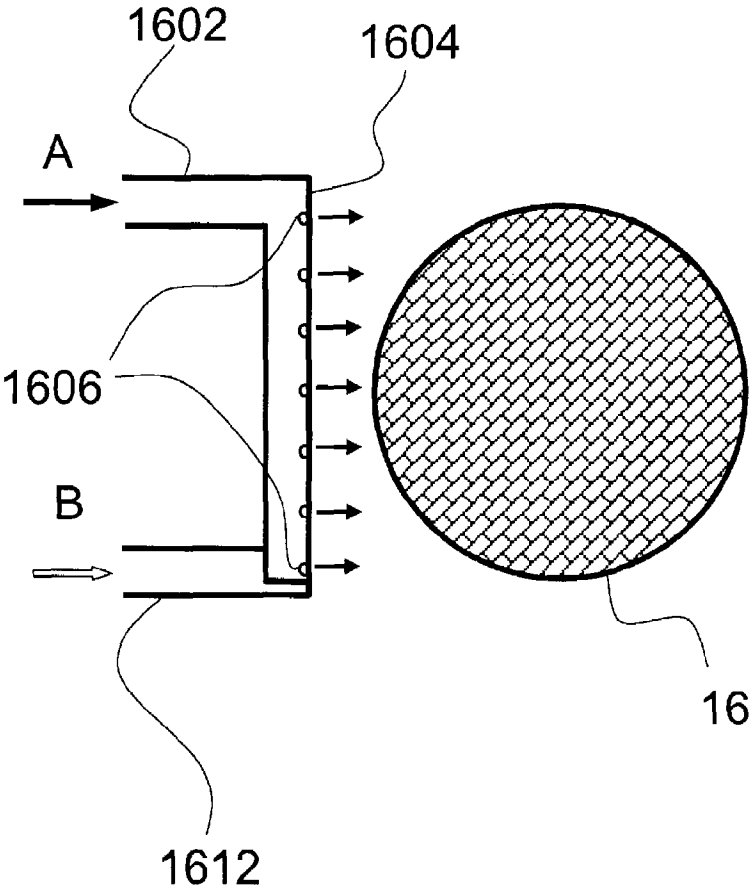

FIG. 16a shows a schematic top view of a gas injection structure with a shower tube arrangement in relation to a wafer. L-shaped shower tubes are placed in front of a wafer 16. Reactant vapor or inactive gas flows first along a hollow feed section 1602 of the shower tube then along the lateral distributor section 1604 in the shower tube and finally out of the apertures 1606 to the reaction chamber where the wafer 16 is located. Also shown in FIG. 16a is a hollow feed section 1612 of a second shower tube, as will be appreciated from FIG. 16b and corresponding description below.

FIG. 16b shows a schematic side view of the shower tube arrangement of FIG. 16a wherein two shower tubes are placed one above the other. Reactant A vapor flows out of the first apertures 1606 in the first lateral distributor section 1604 during the pulse time of reactant A. When the reactant. A pulse is switched off, inactive gas flows out of the first apertures 1606 of the first lateral distributor section 1604. Reactant B vapor flows out of second apertures 1616 of a second lateral distributor section 1614 during the pulse time of reactant B. When the reactant B pulse is switched off, inactive gas flows out of the second apertures 1616 of the second lateral distributor section 1614. During a purge time inactive gas flows out of all the apertures 1606, 1616 into the reaction chamber where the substrate 16 is located. Dynamic pressure control of the reaction chamber can be applied during the deposition process so that gases coming out of one shower tube do not noticeably shade any substrate area from the gases that are coming out of the other shower tube. An optional booster step with inactive gas after each precursor pulse enhances the removal of residual precursor vapor from the shower tubes and the reaction chamber.

The gas injectors of the preferred embodiments, including the single distributor tube (per reactant) and showerhead rake structures, are simple and cheap to manufacture. They may be configured so that they may be suitable as consumable items for after sales marketing. For instance, as mentioned above, the gas injectors described herein can be attached to gas channel openings for example with tolerance fitting, o-ring seal, axial shaft seal, or by any other means known by those skilled in the art. By providing hollow tubes with apertures therein, where the tubes are independent of and connectable to the walls, the gas injectors are replaceable and they are preferably discarded when reactant buildup results in less than optimal operation. Additionally, because the gas injectors are replaceable parts protruding into the reaction chamber, the customer can select an injector structure according to specific needs. For example, the size, the number and the location of the apertures can be optimized so that the whole wafer will be exposed uniformly to the reactant gas. Advantageously, the entire chamber does not require disassembly in order to replace the gas injectors; rather, the chamber can simply be opened and the gas injector part (e.g., gas inlets of FIG. 1 or the showerhead rakes of FIG. 9) can be readily replaced with minimal reactor downtime and minimal retuning after replacement.

Furthermore, the illustrated gas injectors are particularly conducive to efficient purging without a flow-through arrangement. For example, the gas injectors described herein readily distribute gas across the surface of the wafer, and are not constrained to a particular flow path, in contrast to laminar flow reactor designs. Unlike conventional showerhead arrangements, however, excess reactant, by-product and purge gases are allowed to flow through the plane of the gas injectors (see, e.g., FIG. 13b), thereby enabling placement of the spaced injector tubes between the planes of substrate and the exhaust outlet. One advantage of such an arrangement is that reactants are allowed to spread out over the substrate surface during reactant steps or pulses, without creating pockets of dead zones where reactant gas can avoid the purging process.

The skilled artisan will readily appreciate from the disclosure herein that the gas injectors of the preferred embodiments allow gas spreading across the substrate by diffusion and/or pressure fluctuation after exiting the apertures. Similarly, purging is made more efficient by allowing purge gas to sweep away reactant gases from the substrate, aided in certain embodiments by multiple sequential purge pulses and the pressure gradients thereby created. These functions are facilitated by keeping the substrate stationary relative to the injectors during deposition in the illustrated embodiments, allowing gas spreading by diffusion and/or pressure fluctuation even in rather short pulse intervals required by commercial implementation of ALD. Accordingly, the substrate does not rotate during operation of the illustrated embodiments.

While the invention has been described with reference to certain preferred embodiments, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to any particular embodiment disclosed for carrying out this invention, but that the invention will include all embodiments falling within the scope of the appended claims.

We claim:

1. An apparatus for depositing a thin film on a substrate, comprising:

a reaction chamber having a reaction space;

a substrate holder for holding the substrate *horizontally* within the reaction space;

a gas outlet in fluid communication with the reaction space; *and* a gas injector structure positioned with the reaction chamber fixed relative to the substrate during deposition, the gas injector structure comprising:

a first gas injector being in fluid communication with a first reactant gas source and a purge gas source*, the first gas injector positioned outside a circumference of the substrate at a first angular position relative to the substrate, the first angular position defined by a first aperture of the first gas injector located closest to the substrate, the first aperture configured to supply a first reactant vapor from the first reactant gas source to the substrate in a first direction*; and a second gas injector being in fluid communication with a second reactant gas source and a purge gas source[;]*, the second gas injector positioned outside a circumference of the substrate at a second angular position relative to the substrate, the second angular position defined by a second aperture of the second gas injector located closest to the substrate, the second aperture configured to supply a second reactant vapor from the second reactant gas source to the substrate in a second direction,* wherein the first and second gas injectors include hollow tubes extending in the reaction space, the hollow tubes including a plurality of gas flow apertures spaced along respective tube axes of elongation, the apertures opening to the reaction space*, the plurality of gas flow apertures including at least the first aperture and the second aperture,*

*wherein the gas outlet is positioned outside the circumference of the substrate at a third angular position relative to the substrate, the third angular position defined by a point on the gas outlet located closest to the substrate, the gas outlet configured to exhaust each of the first reactant vapor and the second reactant vapor in a third direction from the substrate to the gas outlet, wherein each of the first, second and third angular positions are different and angularly spaced from each other outside the circumference of the substrate,*

*wherein the first injector, the second injector and the gas outlet are positioned such that the first reactant vapor turns over the substrate from the first direction to the third direction, including turning in a horizontal plane, and*

*wherein the apparatus further comprises controls configured to alternately pulse the first and the second reactant vapors into the reaction space.*

2. The apparatus of claim 1, wherein the gas injector structure is between about 10-60 mm above the substrate holder.

3. The apparatus of claim 1, wherein the substrate holder is an end effector of a wafer handler.

4. The apparatus of claim 1, wherein the substrate holder is a platform comprising a heated susceptor plate.

5. The apparatus of claim 1, wherein the substrate holder holds the substrate in place by operation of the Bernoulli principle.

6. The apparatus of claim 1, wherein the gas injector structure is below the substrate holder.

7. The apparatus of claim 6, wherein the substrate holder is a vacuum chuck.

[8. The apparatus of claim 1, wherein the first and the second gas injectors each include a spiral-shaped portion, and the spiral-shaped portion the first injector is interlaced with the spiral-shaped portion of the second gas injector.]

9. The apparatus of claim 1, wherein the apertures have a circular shape.

10. The apparatus of claim 1, wherein the apertures have an ovular shape.

11. The apparatus of claim 1, wherein the first and second gas injectors include distributor tube sections on opposite sides of the substrate holder.

12. The apparatus of claim 11, wherein the apertures are formed on the distributor tube sections and the apertures of the first and second gas injectors substantially face each other in a plane adjacent the substrate.

13. The apparatus of claim 11, wherein the apertures are formed on the distributor tube sections and the apertures of the first and second gas injectors substantially face away from each other in a plane adjacent the substrate.

[14. The apparatus of claim 11, wherein each of the first and second gas injectors includes a plurality of hollow fingers branching from their respective distributor tube sections, the apertures being formed on the hollow fingers.]

[15. The apparatus of claim 14, wherein the hollow fingers of each injector extend parallel to one another.]

[16. The apparatus of claim 15, wherein the hollow fingers of the first gas injector alternate with the hollow fingers of the second gas injector across an injection plane.]

17. The apparatus in claim 1, wherein the apertures are each spaced between about 10-30 mm apart along their respective tube axes of elongation.

18. The apparatus in claim 1, wherein the gas outlet is fluidly connected to a vacuum.

19. The apparatus in claim 1, wherein the gas outlet communicates with a venturi.

20. The apparatus in claim 1, wherein the hollow tubes are positioned such that exhaust flows, in sequence, from the substrate, between the hollow tubes of the first and second gas injectors, and into the gas outlet.

21. The apparatus in claim 20, wherein the gas outlet is positioned in a plane above the gas injection structure and the substrate holder is positioned below the gas injection structure.

[22. The apparatus of claim 1, wherein the hollow tubes comprise a plurality of first hollow fingers for the first gas injector and a plurality of second hollow fingers for the second gas injector.]

[23. The apparatus of claim 22, wherein the hollow tubes further comprise:

a first distributor tube communicating gas to each of the first fingers; and a second distributor tube communicating gas to each of the second fingers.]

[24. The apparatus of claim 1, wherein the first injector is positioned between the second injector and the substrate holder.]

25. The apparatus of claim 1, wherein the gas injector structure further comprises a third gas injector in fluid communication with a third reactant gas source and the purge gas source, wherein the third gas injector includes a hollow tube extending in the reaction space, the hollow tube including a plurality of gas flow apertures spaced along an axis of tube elongation, the apertures opening to the reaction space, *wherein the third injector is positioned outside the circumference of the substrate at a fourth angular position relative to the substrate, the fourth angular position defined by a third aperture of the third gas injector located closest to the substrate, the third aperture configured to supply a third reactant vapor, different from the first and second reactant vapors, to the substrate in a fourth direction; wherein each of the first, second, third and fourth angular positions are different and angularly spaced from each other outside the circumference of the substrate.*

26. The apparatus of claim 1, further comprising a gas flow restrictor positioned between the reaction space and the gas outlet.

27. The apparatus of claim 1, [further comprising controls for] *wherein the controls are further configured to* alternately [providing] *provide* first reactant *flow* to the first gas injector while stopping second reactant flow to the second gas injector and [providing] *to provide* second reactant flow to the second gas injector while stopping first reactant flow to the first gas injector.

28. The apparatus of claim [27] *1*, further comprising:

a first purge channel communicating purge gas to the first injector;

a first reactant channel communicating *the* first reactant *vapor* to the first gas injector;

a second purge channel communicating purge gas to the second gas injector; and a [first] *second* reactant channel communicating *the* second reactant *vapor* to the second gas injector, wherein the first and second purge gas channels are more restrictive than the first and second reactant channels, respectively.

29. The apparatus of claim 28, further comprising at least one booster valve selectively communicating purge gas to the first and second reactant channels, the controls providing a booster purge gas pulse to the first and second reactant channels during an initial pulse of a purge gas step while providing only purge gas through the first and second purge channels during a second pulse of the purge gas step.

30. An apparatus for depositing thin films on a substrate, comprising:

a reaction chamber;

a substrate support configured to receive a substrate disposed within the reaction chamber; and a showerhead rake structure positioned adjacent the substrate support comprising:

a first gas injector having a first rake in fluid communication with a first reactant source, the first rake including a plurality of first fingers extending from and in fluid communication with a first gas distribution structure, each of the first fingers having first apertures along a length thereof; and a second gas injector positioned opposite from the first gas injector having a second rake in fluid communication with a second reactant source, the second rake including a plurality of second fingers extending from and in fluid communication with a second distribution structure, each of the second fingers having second apertures along a length thereof;

wherein the first reactant source comprises a first precursor and the second reactant source comprises a second precursor, the second precursor being reactive with chemisorbed first precursor on the substrate.

31. The apparatus of claim 30, wherein the first gas injector comprises a first distributor tube extending within the reaction chamber and the second distribution structure comprises a second distributor tube extending within the reaction chamber.

32. The apparatus of claim 30, wherein the first fingers are parallel to one another and the second fingers are parallel to one another.

33. The apparatus of claim 32, wherein the first fingers are staggered with the second fingers across a gas injection plane adjacent the substrate support.

34. The apparatus in claim 33, wherein a distance between one of the first fingers and an adjacent one of the second finger is between about 1-50 mm.

35. The apparatus in claim 30, wherein the showerhead rake structure is positioned adjacent the substrate support to face and distribute gas across a major surface of the substrate supported thereon.

36. The apparatus in claim 35, wherein the showerhead rake structure is positioned between about 5-50 mm above the substrate support.

37. The apparatus in claim 36, wherein the substrate support is a platform comprising a heated susceptor plate.

38. The apparatus in claim 35, wherein the showerhead rake structure is positioned below the platform.

39. The apparatus in claim 38, wherein the substrate support is a vacuum chuck.

40. The apparatus in claim 30, wherein the apertures of each finger are spaced between about 10-30 mm apart along a surface of the finger parallel to a finger axis.

41. The apparatus in claim 30, further comprising a gas outlet in fluid communication with the reaction chamber, wherein the gas outlet comprises:

a channel for restricting gas flow; and an exhaust duct in fluid communication with the channel.

42. The apparatus of claim 30, further comprising a gas outlet in fluid communication with the reaction chamber, the showerhead rake structure being positioned between the outlet and the substrate.

43. The apparatus of claim 30, wherein the substrate support is held fixed relative to the showerhead structure during deposition.

*44. The apparatus of claim 1, wherein the gas outlet serves as the sole gas outlet in fluid communication with the reaction space.*

*45. The apparatus of claim 1, wherein the controls are configured to provide intervening purges steps between alternating pulses of the first and second reactant vapors to the reaction space.*

*46. The apparatus of claim 1, wherein the controls are further configured to alternately provide the first reactant vapor to the reaction space while flow of the second reactant vapor into the reaction space is prevented and to provide the second reactant vapor to the reaction space while flow of the first reactant vapor into the reaction space is prevented.*

*47. The apparatus of claim 46, wherein the controls are further configured to alternately provide a purge gas to the reaction space while flow of the second reactant vapor to the reaction space is prevented and to provide a purge gas to the reaction space while flow of the first reactant vapor to the reaction space is prevented.*

*48. The apparatus of claim 28, wherein the controls are further configured to prevent the second reactant vapor from flowing to the substrate while the first reactant vapor is being provided to the first gas injector and to prevent the first reactant vapor from flowing to the substrate while the second reactant vapor is being provided to the second gas injector.*

*49. The apparatus of claim 1, wherein the controls are further configured to alternately provide in sequence:*

*the first reactant vapor to the first gas injector while preventing flow of the second reactant vapor to the second gas injector and providing a purge gas to the second gas injector;*

*purge gas to the first and second gas injectors while preventing flow of the first and second reactant vapors to the first and second gas injectors;*

*the second reactant vapor to the second gas injector while preventing flow of the first reactant vapor to the first gas injector and providing purge gas to the first gas injector; and*

*purge gas to the first and second gas injectors while preventing flow of the first and second reactant vapors to the first and second gas injectors.*

*50. The apparatus of claim 1, wherein the first and second gas injectors and the gas outlet are configured to provide nonlaminar flow of the first and second reactant vapors over the substrate.*

*51. The apparatus of claim 1 wherein a flow pattern modifier is positioned within the gas outlet.*

*52. The apparatus of claim 51 wherein the flow pattern modifier is positioned in the middle of the gas outlet.*

*53. The apparatus of claim 1, wherein the first injector, the second injector and the gas outlet are positioned such that the second reactant vapor turns over the substrate from the second direction to the third direction, including turning in a horizontal plane.*

* * * * *